(12) United States Patent
Kuwajima et al.

(10) Patent No.: US 7,489,036 B2
(45) Date of Patent: Feb. 10, 2009

(54) THIN-FILM DEVICE

(75) Inventors: Hajime Kuwajima, Tokyo (JP); Masahiro Miyazaki, Tokyo (JP); Akira Furuya, Tokyo (JP); Masahiro Itoh, Tokyo (JP)

(73) Assignee: TDK Corporation, Tokyo (JP)

( * ) Notice: Subject to any disclaimer, the term of this patent is extended or adjusted under 35 U.S.C. 154(b) by 124 days.

(21) Appl. No.: 11/701,458

(22) Filed: Feb. 2, 2007

(65) Prior Publication Data

US 2007/0194404 A1  Aug. 23, 2007

(30) Foreign Application Priority Data

Feb. 17, 2006  (JP) ............... 2006-041227

(51) Int. Cl.
*H01L 23/48* (2006.01)
(52) U.S. Cl. .................. 257/735; 257/701; 257/758; 257/E23.01
(58) Field of Classification Search .......... 257/701, 257/735, 750, 752, 758, 774, 776
See application file for complete search history.

(56) References Cited

U.S. PATENT DOCUMENTS 6,276,995 B1  8/2001  Matsuta et al.
6,445,254 B1*  9/2002  Shibuya et al. ............. 331/68
2002/0053742 A1*  5/2002  Hata et al. .................. 257/774
2002/0136873 A1*  9/2002  Li et al. ..................... 428/209

FOREIGN PATENT DOCUMENTS

| JP | A 02-114601 | 4/1990 |
| JP | A 02-121313 | 5/1990 |
| JP | A 04-037105 | 2/1992 |
| JP | A 05-129149 | 5/1993 |
| JP | A 09-045580 | 2/1997 |
| JP | A 10-163002 | 6/1998 |
| JP | A 11-003833 | 1/1999 |

* cited by examiner

*Primary Examiner*—Wai-Sing Louie
(74) *Attorney, Agent, or Firm*—Oliff & Berridge, PLC

(57) ABSTRACT

A thin-film device incorporates: a substrate; an insulating layer, a lower conductor layer, a dielectric film, an insulating layer, an upper conductor layer and a protection film that are stacked in this order on the substrate; and four terminal electrodes. The four terminal electrodes touch part of end faces of the upper conductor layer, and part of the top surface of the upper conductor layer contiguous to the end faces. The protection film has four concave portions, each of which has a shape that is recessed inward from the edge of the protection film except portions thereof corresponding to these concave portions. The four concave portions expose respective portions of the top surface of the upper conductor layer that touch the four terminal electrodes. The four concave portions accommodate respective portions of the four terminal electrodes.

16 Claims, 19 Drawing Sheets

THIN-FILM DEVICE

BACKGROUND OF THE INVENTION

1. Field of the Invention

The present invention relates to a thin-film device incorporating a conductor layer and a terminal electrode connected to the conductor layer.

2. Description of the Related Art

With increasing demands for reductions in dimensions and thickness of high frequency electronic apparatuses such as cellular phones, reductions in dimensions and profile of electronic components mounted on the high frequency electronic apparatuses have been sought. Some of the electronic components have such a configuration that insulating layers and conductor layers are formed on a substrate through the use of thin-film forming techniques. Such electronic components formed through the use of thin-film forming techniques are called thin-film device in the present patent application.

In a thin-film device, terminal electrodes are provided for connecting conductor layers to an external circuit. Here, a portion of the thin-film device other than the terminal electrodes is called a device main body. Each conductor layer connected to the terminal electrodes includes a wiring portion, for example, and is formed so that an end face of the wiring portion is exposed at a side surface of the device main body. In this case, the terminal electrodes are disposed on the side surfaces of the device main body, for example, so as to be connected to the end faces of the wiring portion.

Here is given an example of a method of manufacturing a thin-film device wherein the terminal electrodes are disposed on the side surfaces of the device main body. In the method, first, a thin-film device substructure is fabricated by forming layers such as conductor layers corresponding to a plurality of thin-film devices on a single wafer (a substrate). The substructure includes a plurality of preliminary device main body portions each of which will be a device main body. Furthermore, in the substructure, there are provided portions to be removed between respective adjacent ones of the preliminary device main body portions. Next, the plurality of preliminary device main body portions are divided into a plurality of device main bodies by cutting the substructure at positions of the portions to be removed. By cutting the substructure in such a manner, side surfaces of the device main bodies are formed, and end faces of wiring portions to be connected to terminal electrodes are exposed at the side surfaces. Next, the terminal electrodes are formed on the side surfaces of the device main bodies.

To reduce the dimensions and profile of a thin-film device, it is effective to reduce the thickness of layers such as conductor layers. However, according to the above-described method, a reduction in thickness of conductor layers causes a reduction in area of the end faces of the wiring portion connected to the terminal electrodes. As a result, the regions in which the conductor layers touch the terminal electrodes are reduced in area, and accordingly it becomes difficult to secure the reliability of connection between the conductor layers and the terminal electrodes.

To avoid this problem, such a technique is conceivable that the wiring portion may be increased in width to thereby increase the area of the end faces of the wiring portion. However, this may cause a problem in the thin-film device that the density of the wiring portion is reduced and therefore it becomes difficult to reduce the dimensions of the thin-film device, or that the impedance of the wiring portion deviates from a desired value and the characteristics of the thin-film device are thereby degraded.

JP 10-163002A discloses a technique wherein, in a chip-shaped electronic component in which an inner conductor film is disposed on a substrate and external terminal electrodes are connected to end faces of the inner conductor film, the end faces of the inner conductor film are tilted with respect to a sectional surface of the substrate.

JP 11-003833A discloses a technique wherein, in an electronic component in which electrodes are disposed on a substrate and external terminals are connected to end faces of the electrodes, the end faces of the electrodes on the substrate are tilted with respect to a sectional surface of the substrate.

JP 4-037105A discloses a thin-film capacitor wherein: there are stacked on a substrate a pair of inner electrode layers, a dielectric layer disposed between the pair of inner electrode layers, and a protection film covering the inner electrode layers and the dielectric layer; and outer electrode layers connected to the inner electrode layers are disposed on side surfaces of the substrate. JP 4-037105A discloses a technique wherein portions of the top surfaces of the inner electrode layers near the side surfaces of the substrate are exposed instead of being covered with the protection film, and the outer electrode layers are connected to the end faces and the portions of the top surfaces of the inner electrode layers.

JP 2-121313A discloses a thin-film capacitor wherein: three or more inner electrode layers and two or more dielectric layers are alternately stacked on a substrate; the inner electrode layers and the dielectric layers are covered with a protection film; and outer electrodes connected to the inner electrode layers are disposed on side surfaces of the substrate. JP 2-121313A discloses a technique wherein portions of the top surfaces of the inner electrode layers near the side surfaces of the substrate are exposed instead of being covered with the protection film, and the outer electrodes are connected to the end faces and the portions of the top surfaces of the inner electrode layers.

JP 5-129149A discloses a thin-film capacitor wherein: four inner electrodes and four dielectric thin films are alternately stacked on a substrate; the inner electrodes and the dielectric thin films are covered with an inorganic insulating film and a resin layer; and outer electrodes connected to the inner electrodes are disposed on side surfaces of the substrate. JP 5-129149A discloses a technique wherein portions of the top surfaces of the inner electrodes near the side surfaces of the substrate are exposed instead of being covered with the inorganic insulating film and the resin layer, and the outer electrodes are connected to the end faces and the portions of the top surfaces of the inner electrodes.

In the following description the external terminal electrodes of JP 10-163002A, the external terminals of JP 11-003833A, the external electrode layers of JP 4-037105A, and the external electrodes of JP 2-121313A and JP 5-129149A are all called terminal electrodes.

As previously described, in a thin-film device in which terminal electrodes are disposed on the side surfaces of the device main body, a reduction in thickness of conductor layers causes a reduction in area of the end faces of the wiring portion connected to the terminal electrodes, and as a result, the regions in which the conductor layers touch the terminal electrodes are reduced in area and accordingly it becomes difficult to secure the reliability of connection between the conductor layers and the terminal electrodes.

According to the techniques disclosed in the two publications of JP 10-163002A and JP 11-003833A, it is possible to increase the area of the regions in which the conductor layers touch the terminal electrodes, but the amount of increase in the area is very small. It is therefore difficult to secure a satisfactory degree of reliability of connection between the conductor layers and the terminal electrodes through the use of the techniques disclosed in these two publications.

According to the techniques disclosed in the three publications of JP 4-037105A, JP 2-121313A and JP 5-129149A, it is possible to greatly increase the areas of the regions in which the conductor layers touch the terminal electrodes, compared with the case in which the terminal electrodes touch only the end faces of the conductor layers. However, the following problems arise if the techniques disclosed in these three publications are applied to thin-film devices in general. According to the techniques disclosed in the three publications, it is difficult to precisely control the shapes and locations of the terminal electrodes, which results in increases in variations in shapes and locations of the terminal electrodes among products. If such variations among products occur, there is a possibility that variations may occur in magnitude of electromagnetic coupling or capacitive coupling between the conductor layers and the terminal electrodes, and electrical characteristics of the thin-film devices may vary. Furthermore, in the case in which the number of terminal electrodes is large, in particular, if there occur variations in shapes and locations of the terminal electrodes among products, variations in distance between the respective adjacent ones of the terminal electrodes occur, which results in variations in electrical characteristics of the thin-film devices and/or short-circuit between adjacent ones of the terminal electrodes. These problems become more noticeable as the number of the terminal electrodes increases and downsizing of the thin-film devices proceeds.

OBJECT AND SUMMARY OF THE INVENTION

It is an object of the invention to provide a thin-film device incorporating a conductor layer and a terminal electrode connected to the conductor layer, the thin-film device being capable of enhancing the reliability of connection between the conductor layer and the terminal electrode and capable of suppressing variations in shape and location of the terminal electrode.

A thin-film device of the invention incorporates a substrate, a protection film, a conductor layer and a terminal electrode. The substrate has a first surface and a second surface that face toward opposite directions, and a side surface coupling the first and second surfaces to each other. The protection film is disposed such that one of surfaces thereof faces toward the first surface of the substrate. The conductor layer is disposed between the first surface of the substrate and the protection film, and has a bottom surface facing toward the first surface of the substrate, a top surface opposite to the bottom surface, and an end face coupling the bottom and top surfaces to each other. The terminal electrode is connected to the conductor layer. Furthermore, the terminal electrode touches part of the end face of the conductor layer and part of the top surface of the conductor layer contiguous to the end face. The protection film has a concave portion having a shape that is recessed inward from an edge of the protection film except a portion thereof corresponding to the concave portion. The concave portion exposes the part of the top surface of the conductor layer that touches the terminal electrode. The concave portion accommodates part of the terminal electrode.

According to the thin-film device of the invention, the terminal electrode touches part of the end face of the conductor layer and part of the top surface of the conductor layer contiguous to the end face. The concave portion of the protection film exposes the part of the top surface of the conductor layer that touches the terminal electrode, and the concave portion accommodates part of the terminal electrode.

In the thin-film device of the invention, when the protection film is seen from above, the edge of the protection film except the portion thereof corresponding to the concave portion may be located at a position that coincides with an edge of a surface located directly below the protection film. Alternatively, when the protection film is seen from above, the edge of the protection film except the portion thereof corresponding to the concave portion may be located on an inner side relative to an edge of the surface located directly below the protection film.

In the thin-film device of the invention, the terminal electrode may further touch part of the side surface of the substrate.

In the thin-film device of the invention, the terminal electrode may further touch part of the first surface of the substrate.

In the thin-film device of the invention, the terminal electrode may further touch part of the first surface of the substrate and part of the side surface of the substrate.

The thin-film device of the invention may further incorporate an insulating layer disposed between the first surface of the substrate and the conductor layer. The insulating layer has a bottom surface facing toward the first surface of the substrate, a top surface opposite to the bottom surface, and an end face coupling the bottom and top surfaces to each other.

In the thin-film device of the invention, the terminal electrode may further touch part of the end face of the insulating layer.

In the thin-film device of the invention, the terminal electrode may further touch part of the top surface of the insulating layer.

In the thin-film device of the invention, the terminal electrode may further touch part of the top surface of the insulating layer and part of the end face of the insulating layer.

In the thin-film device of the invention, the terminal electrode may further touch part of the end face of the insulating layer and part of the side surface of the substrate.

In the thin-film device of the invention, the terminal electrode may further touch part of the end face of the insulating layer and part of the first surface of the substrate.

In the thin-film device of the invention, the terminal electrode may further touch part of the end face of the insulating layer, part of the first surface of the substrate, and part of the side surface of the substrate.

In the thin-film device of the invention, the terminal electrode may further touch part of the top surface of the insulating layer, part of the end face of the insulating layer, and part of the side surface of the substrate.

In the thin-film device of the invention, the terminal electrode may further touch part of the top surface of the insulating layer, part of the end face of the insulating layer, and part of the first surface of the substrate.

In the thin-film device of the invention, the terminal electrode may further touch part of the top surface of the insulating layer, part of the end face of the insulating layer, part of the first surface of the substrate, and part of the side surface of the substrate.

According to the thin-film device of the invention, the terminal electrode touches part of the end face of the conductor layer and part of the top surface of the conductor layer contiguous to the end face. As a result, according to the invention, it is possible to increase the area of the region in which the conductor layer touches the terminal electrode and to thereby enhance the reliability of connection between the conductor layer and the terminal electrode. Furthermore, according to the invention, the concave portion of the protection film exposes the part of the top surface of the conductor layer that touches the terminal electrode, and accommodates part of the terminal electrode. As a result, according to the invention, it is possible to suppress variations in shape and location of the terminal electrode.

Other and further objects, features and advantages of the invention will appear more fully from the following description.

DESCRIPTION OF PREFERRED EMBODIMENTS

First Embodiment

Figure 6:
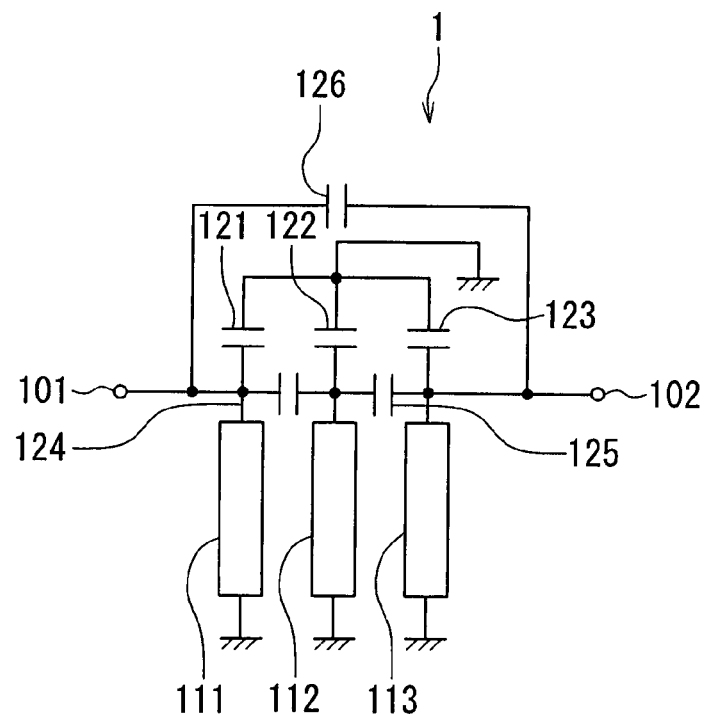
FIG. 6 is a schematic diagram illustrating the circuit configuration of the thin-film device of the first embodiment of the invention.

Preferred embodiments of the invention will now be described in detail with reference to the accompanying drawings. Reference is now made to FIG. 6 to describe the circuit configuration of a thin-film device of a first embodiment of the invention. FIG. 6 is a schematic diagram illustrating the circuit configuration of the thin-film device of the first embodiment.

As shown in FIG. 6, the thin-film device 1 of the embodiment incorporates: two input/output terminals 101 and 102 for receiving and outputting signals; and three inductors 111, 112 and 113.

The thin-film device 1 further incorporates: a capacitor 121 provided between one of ends of the inductor 111 and the ground; a capacitor 122 provided between one of ends of the inductor 112 and the ground; a capacitor 123 provided between one of ends of the inductor 113 and the ground; a capacitor 124 provided between the one of the ends of the inductor 111 and the one of the ends of the inductor 112; a capacitor 125 provided between the one of the ends of the inductor 112 and the one of the ends of the inductor 113; and a capacitor 126 provided between the one of the ends of the inductor 111 and the one of the ends of the inductor 113.

The input/output terminal 101 is connected to the one of the ends of the inductor 111. The input/output terminal 102 is connected to the one of the ends of the inductor 113. The other of the ends of each of the inductors 111, 112 and 113 is connected to the ground.

The operation of the thin-film device 1 of the embodiment will now be described. The thin-film device 1 of the embodiment has a function of a band-pass filter. If signals are inputted to the input/output terminal 101 of the thin-film device 1, signals at frequencies within a specific frequency band among these signals are selectively outputted from the input/output terminal 102. On the contrary, if signals are inputted to the input/output terminal 102, signals at frequencies within a specific frequency band among these signals are selectively outputted from the input/output terminal 101.

Figure 1:
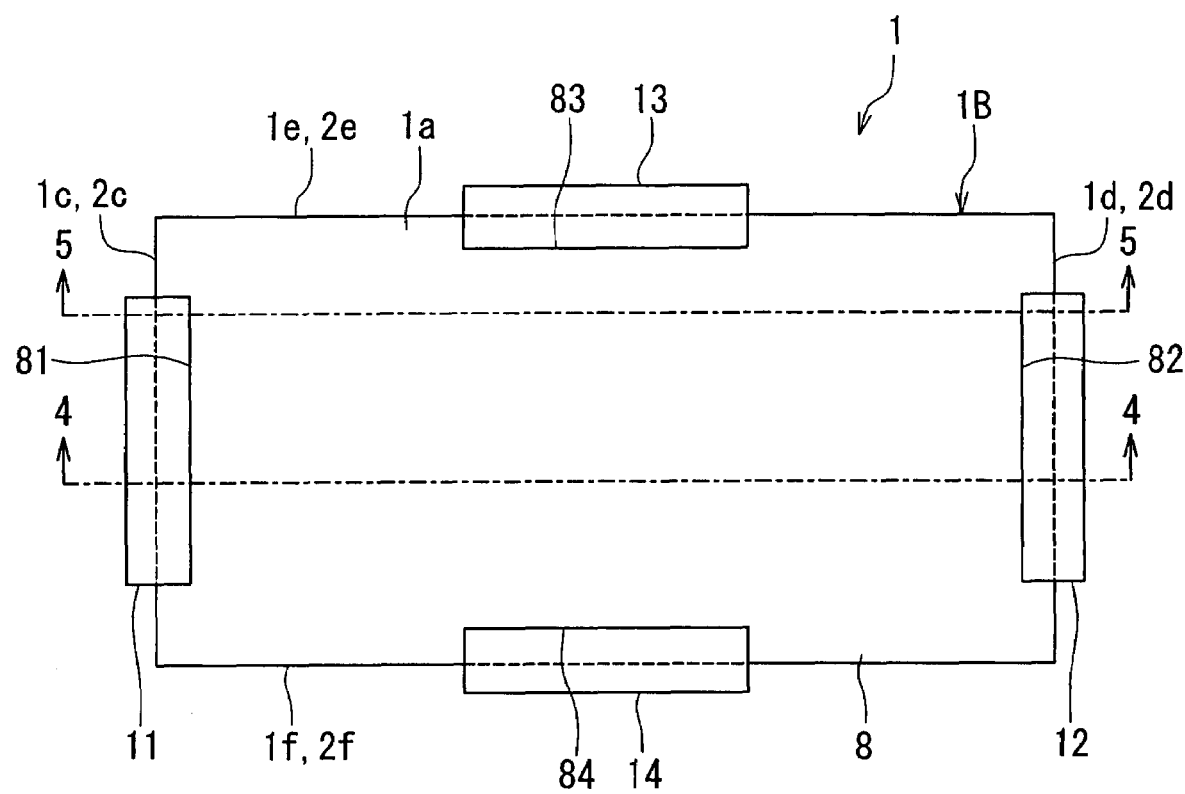
FIG. 1 is a top view of a thin-film device of a first embodiment of the invention.
Figure 2:
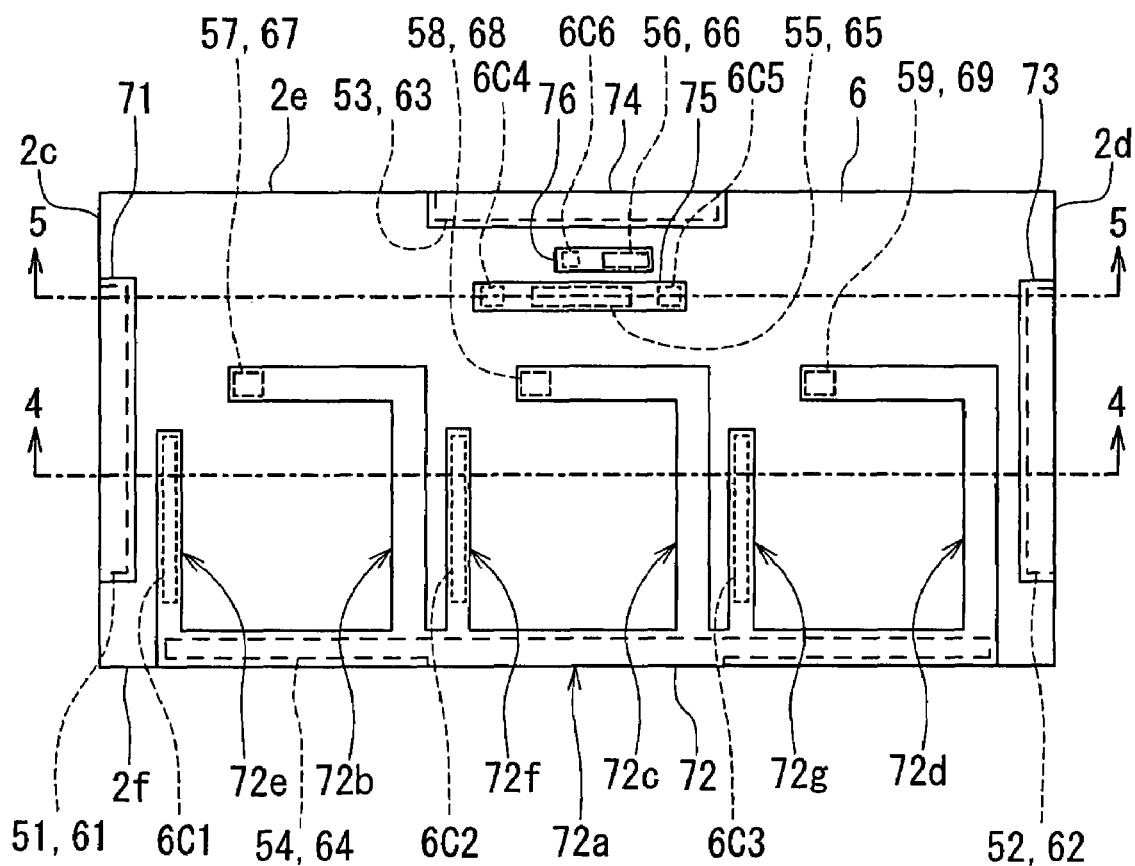
FIG. 2 is a top view of upper conductor layers that the thin-film device of the first embodiment of the invention includes.
Figure 3:
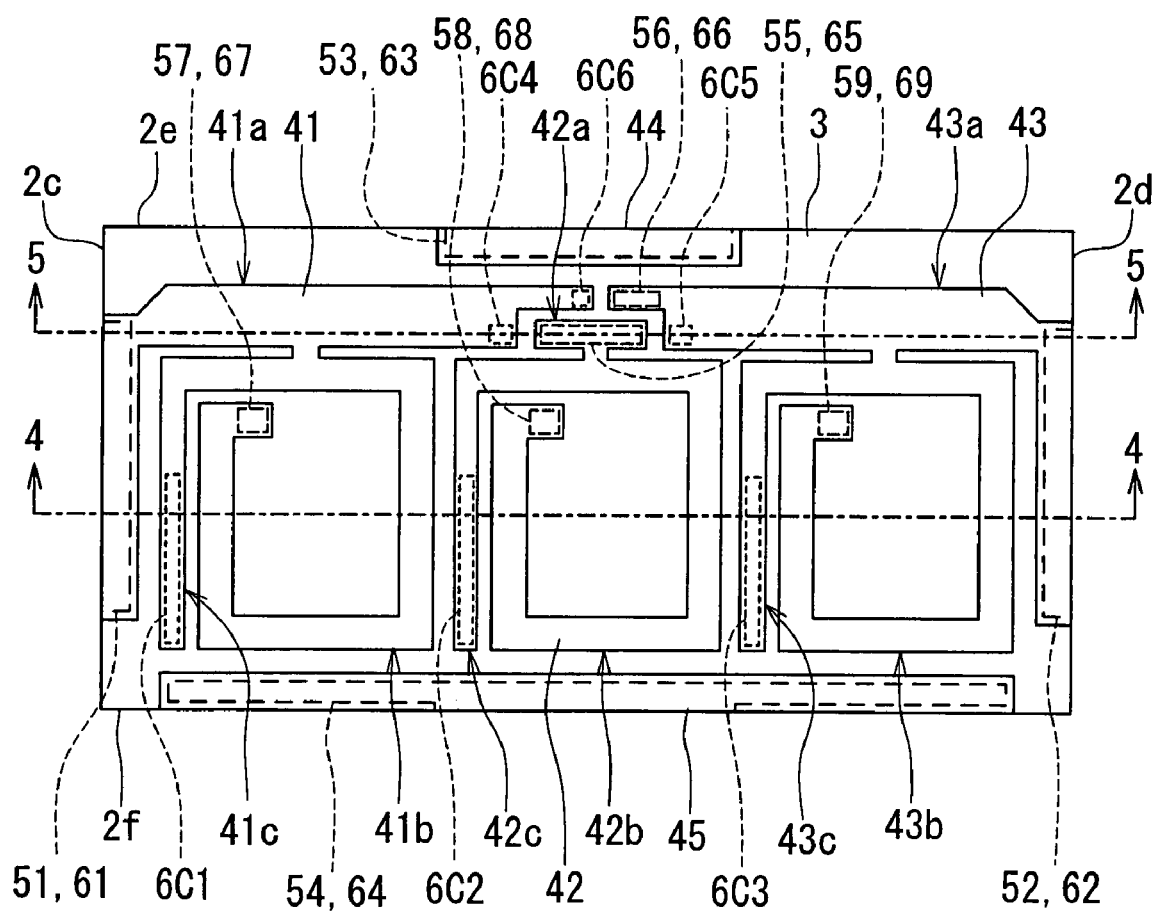
FIG. 3 is a top view of lower conductor layers that the thin-film device of the first embodiment of the invention includes.
Figure 4:
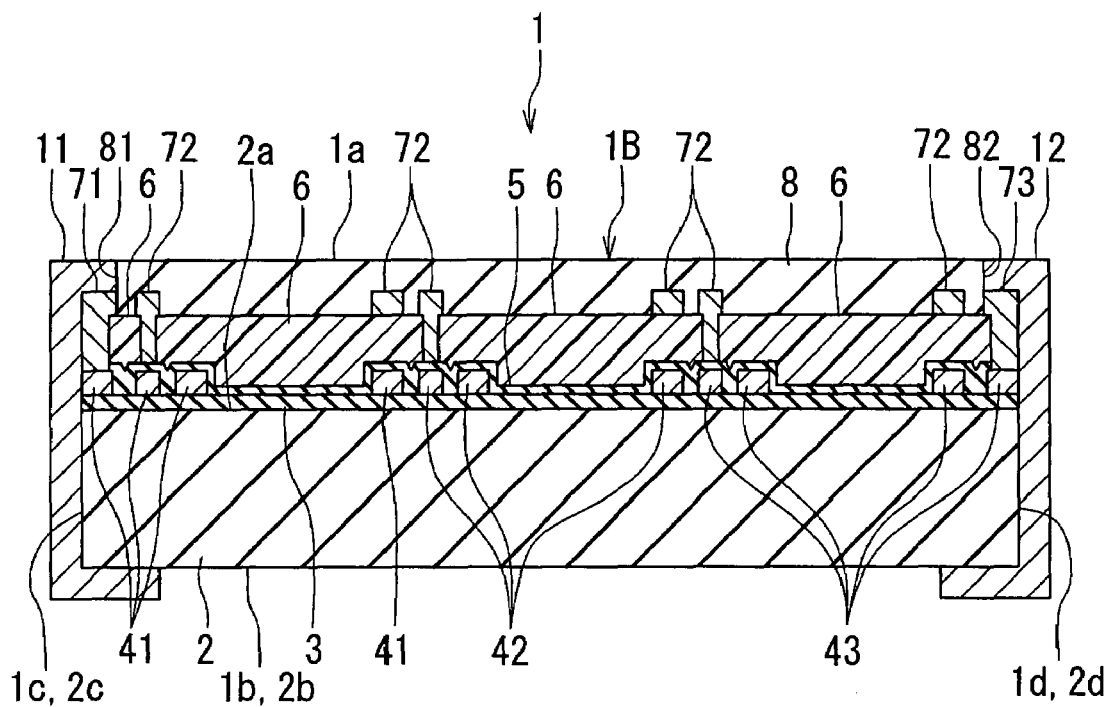
FIG. 4 is a cross-sectional view of the thin-film device taken along line 4-4 of FIG. 1 to FIG. 3.
Figure 5:
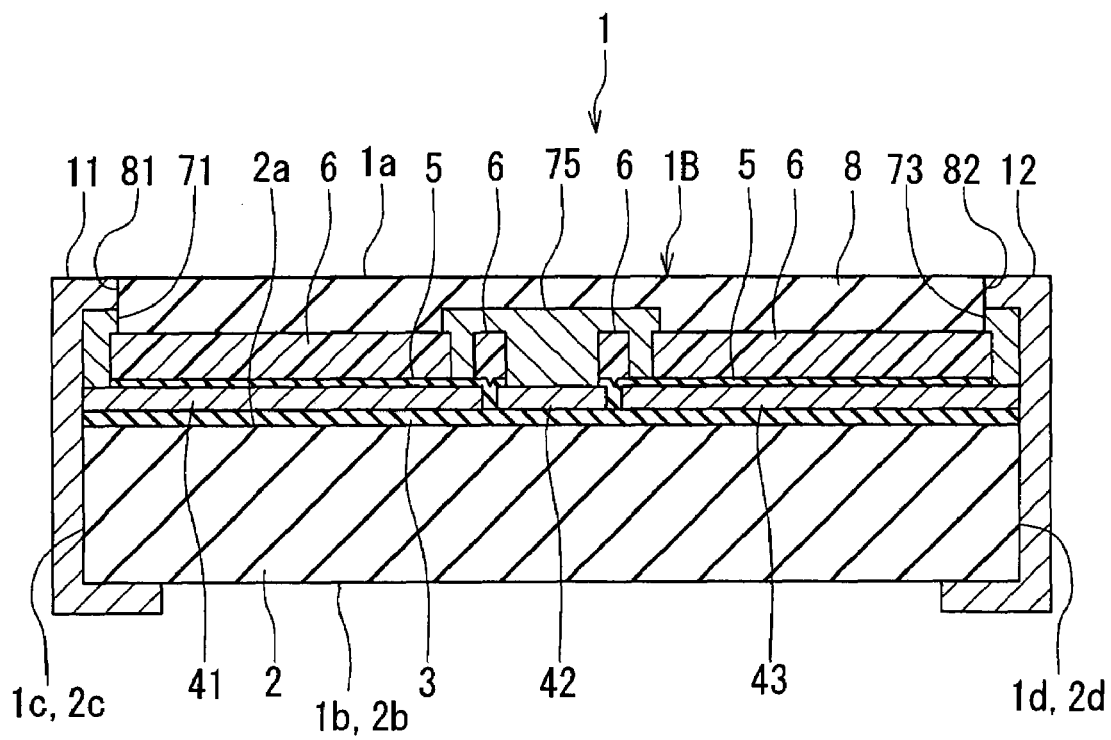
FIG. 5 is a cross-sectional view of the thin-film device taken along line 5-5 of FIG. 1 to FIG. 3.

Reference is now made to FIG. 1 to FIG. 5 to describe the structure of the thin-film device 1 of the embodiment. FIG. 1 is a top view of the thin-film device 1. FIG. 2 is a top view of upper conductor layers that the thin-film device 1 includes. FIG. 3 is a top view of lower conductor layers that the thin-film device 1 includes. Each of FIG. 4 and FIG. 5 is a cross-sectional view of the thin-film device 1. FIG. 4 illustrates a cross section taken along line 4-4 of FIG. 1 to FIG. 3. FIG. 5 illustrates a cross section taken along line 5-5 of FIG. 1 to FIG. 3.

As shown in FIG. 4 and FIG. 5, the thin-film device 1 incorporates a substrate 2 and an insulating layer 3 disposed on the substrate 2. As shown in FIG. 3, the thin-film device 1 further incorporates lower conductor layers 41 to 45 disposed on the insulating layer 3.

As shown in FIG. 4 and FIG. 5, the thin-film device 1 further incorporates: a dielectric film 5 disposed to cover major portions of the insulating layer 3 and the lower conductor layers 41 to 45; and an insulating layer 6 disposed on the dielectric film 5. As shown in FIG. 2, the thin-film device 1 further incorporates upper conductor layers 71 to 76, major portions of which are disposed on the insulating layer 6.

As shown in FIG. 4 and FIG. 5, the thin-film device 1 further incorporates a protection film 8 disposed to cover major portions of the insulating layer 6 and the upper conductor layers 71 to 76. As shown in FIG. 1, the thin-film device 1 further incorporates four terminal electrodes 11 to 14. The terminal electrode 11 forms the input/output terminal 101 of FIG. 6. The terminal electrode 12 forms the input/output terminal 102 of FIG. 6. The terminal electrodes 13 and 14 are adapted to be connected to the ground.

Here, a portion of the thin-film device 1 other than the terminal electrodes 11 to 14 is called a device main body 1B. The device main body 1B is nearly rectangular-solid-shaped, and has a top surface (a top surface of the protection film 8) 1a, a bottom surface (a bottom surface of the substrate 2) 1b, and four side surfaces 1c to 1f coupling the top surface 1a and the bottom surface 1b to each other. The terminal electrodes 11 to 14 are disposed to touch respective portions of the side surfaces 1c to 1f.

The substrate 2 is made of an insulating material (a dielectric material), for example. The insulating material forming the substrate 2 may be an inorganic material or an organic material. The insulating material forming the substrate 2 may be $Al_2O_3$, for example. The substrate 2 may be made of a semiconductor material.

The insulating layer 3 is made of an insulating material. The insulating material forming the insulating layer 3 may be an inorganic material or an organic material. The inorganic material forming the insulating layer 3 may be $Al_2O_3$, for example. The organic material forming the insulating layer 3 may be a resin. In this case, the resin may be a thermoplastic resin or a thermosetting resin. The surface roughness of the top surface of the insulating layer 3 is smaller than that of the top surface of the substrate 2. Therefore, the insulating layer 3 has a function of reducing the surface roughness of a layer underlying the lower conductor layers 41 to 45. It is required that the insulating layer 3 absorb irregularities of the top surface of the substrate 2 and that the top surface of the insulating layer 3 be flat. To achieve this, it is desirable that the insulating layer 3 have a thickness within a range of 0.1 to 10 μm inclusive. If the substrate 2 is made of an insulating material and the surface roughness of the top surface thereof is sufficiently small, the lower conductor layers 41 to 45 may be disposed directly on the substrate 2 without providing the insulating layer 3.

The lower conductor layers 41 to 45, the upper conductor layers 71 to 76, and the terminal electrodes 11 to 14 are made of a conductive material. Each of the lower conductor layers 41 to 45 preferably has a thickness within a range of 5 to 10 μm inclusive. Each of the upper conductor layers 71 to 76 preferably has a thickness within a range of 5 to 10 μm inclusive. Each of the terminal electrodes 11 to 14 preferably has a thickness within a range of 0.5 to 10 μm inclusive, so that breakage of the terminal electrodes 11 to 14 will not occur in corners or stepped portions.

The dielectric film 5 is made of a dielectric material. The dielectric material forming the dielectric film 5 is preferably an inorganic material. The dielectric material forming the dielectric film 5 may be $Al_2O_3$, $Si_4N_3$ or $SiO_2$, for example. The dielectric film 5 preferably has a thickness within a range of 0.02 to 1 μm inclusive, and more preferably within a range of 0.05 to 0.5 μm inclusive.

Each of the insulating layer 6 and the protection film 8 is made of an insulating material. The insulating material forming the insulating layer 6 and the protection film 8 may be an inorganic material or an organic material. The inorganic material forming the insulating layer 6 and the protection film 8 may be $Al_2O_3$, for example. The organic material forming the insulating layer 3 and the protection film 8 may be a resin. In this case, the resin may be a thermoplastic resin or a thermosetting resin. The resin may be any of a polyimide resin, an acrylic resin, an epoxy resin, an ethylene tetrafluoride resin, denatured polyphenylene ether, a liquid crystal polymer, and modified polyimide, for example. The resin may be a photosensitive resin. The insulating layer 6 preferably has a thickness within a range of 0.1 to 10 μm inclusive, so as to improve the reliability of insulation between the upper and lower conductor layers and to improve the high frequency characteristic by suppressing occurrences of unwanted components such as stray capacitance. The protection film 8 preferably has a thickness within a range of 1 to 50 μm inclusive, so as to protect the inside of the product with the protection film 8.

The substrate 2 is rectangular-solid-shaped. The substrate 2 has: a first surface (top surface) 2a and a second surface (bottom surface) 2b that face toward opposite directions; and four side surfaces 2c to 2f that couple the first surface 2a and the second surface 2b to each other. The side surfaces 2c and 2d are shown in FIG. 4 and FIG. 5. However, the side surfaces 2e and 2f do not appear in FIG. 4 and FIG. 5. Therefore, the locations of the side surfaces 2c to 2f are shown in FIG. 1 to FIG. 3 for convenience.

The protection film 8 is disposed such that one of surfaces thereof faces toward the first surface 2a of the substrate 2. Each of the lower conductor layers 41 to 45 and the upper conductor layers 71 to 76 has: a bottom surface facing toward the first surface 2a of the substrate 2; a top surface opposite to the bottom surface; and end faces coupling the bottom and top surfaces to each other, and is disposed between the first surface 2a and the protection film 8.

The insulating layer 3 has: a bottom surface facing toward the first surface 2a of the substrate 2; a top surface opposite to the bottom surface; and end faces coupling the bottom and top surfaces to each other, and is disposed between the first surface 2a and the lower conductor layers 41 to 45.

Reference is now made to FIG. 3 to describe the lower conductor layers 41 to 45 in detail. The lower conductor layer 41 has: a wiring portion 41a; and an inductor-forming portion 41b and a capacitor-forming portion 41c that are connected to the wiring section 41a. When the lower conductor layer 41 is seen from above, a portion of an end face of the wiring portion 41a is located at a position that coincides with the ridgeline between the first surface 2a and the side surface 2c of the substrate 2. The lower conductor layer 42 has: a wiring portion 42a; and an inductor-forming portion 42b and a capacitor-forming portion 42c that are connected to the wiring portion 42a. The lower conductor layer 43 has: a wiring portion 43a; and an inductor-forming portion 43b and a capacitor-forming portion 43c that are connected to the wiring portion 43a. When the lower conductor layer 43 is seen from above, a portion of an end face of the wiring portion 43a is located at a position that coincides with the ridgeline between the first surface 2a and the side surface 2d of the substrate 2.

When the lower conductor layer 44 is seen from above, the lower conductor layer 44 is located near the ridgeline between the first surface 2a and the side surface 2e of the substrate 2, and a portion of an end face of the lower conductor layer 44 is located at a position that coincides with the ridgeline between the first surface 2a and the side surface 2e of the substrate 2. When the lower conductor layer 45 is seen from above, the lower conductor layer 45 is located near the ridgeline between the first surface 2a and the side surface 2f of the substrate 2, and a portion of an end face of the lower conductor layer 45 is located at a position that coincides with the ridgeline between the first surface 2a and the side surface 2f of the substrate 2.

Reference is now made to FIG. 2 to describe the upper conductor layers 71 to 76 in detail. When the upper conductor layer 71 is seen from above, the upper conductor layer 71 is located near the ridgeline between the first surface 2a and the side surface 2c of the substrate 2, and a portion of an end face of the upper conductor layer 71 is located at a position that coincides with the ridgeline between the first surface 2a and the side surface 2c of the substrate 2.

The upper conductor layer 72 has: a wiring portion 72a; and three inductor-forming portions 72b, 72c and 72d and three capacitor-forming portions 72e, 72f and 72g that are connected to the wiring portion 72a. When the upper conductor layer 72 is seen from above, a portion of the inductor-forming portion 72b is located in a region that coincides with a portion of the inductor-forming portion 41b, a portion of the inductor-forming portion 72c is located in a region that coincides with a portion of the inductor-forming portion 42b, and a portion of the inductor-forming portion 72d is located in a region that coincides with a portion of the inductor-forming portion 43b. Furthermore, when the upper conductor layer 72 is seen from above, a portion of the capacitor-forming portion 72e is located in a region that coincides with a portion of the capacitor-forming portion 41c, a portion of the capacitor-forming portion 72f is located in a region that coincides with a portion of the capacitor-forming portion 42c, and a portion of the capacitor-forming portion 72g is located in a region that coincides with a portion of the capacitor-forming portion 43c.

When the upper conductor layer 73 is seen from above, the upper conductor layer 73 is located near the ridgeline between the first surface 2a and the side surface 2d of the substrate 2, and a portion of an end face of the upper conductor layer 73 is located at a position that coincides with the ridgeline between the first surface 2a and the side surface 2d of the substrate 2.

When the upper conductor layer 74 is seen from above, the upper conductor layer 74 is located near the ridgeline between the first surface 2a and the side surface 2e of the substrate 2, and a portion of an end face of the upper conductor layer 74 is located at a position that coincides with the ridgeline between the first surface 2a and the side surface 2e of the substrate 2.

When the upper conductor layer 75 is seen from above, the upper conductor layer 75 is located in a region that coincides with the wiring portion 42a and a portion of each of the wiring portions 41a and 43a. When the upper conductor layer 76 is seen from above, the upper conductor layer 76 is located in a region that coincides with another portion of each of the wiring portions 41a and 43a.

Reference is now made to FIG. 2 and FIG. 3 to describe a plurality of openings formed in each of the dielectric film 5 and the insulating layer 6. In FIG. 2 and FIG. 3 these openings are indicated with broken lines. The dielectric film 5 has openings 51 to 59. The insulating layer 6 has openings 61 to 69 and openings 6C1 to 6C6. The openings 61 to 69 are contiguous to the openings 51 to 59, respectively.

The upper conductor layer 71 is connected to the wiring portion 41a of the lower conductor layer 41 via the openings 51 and 61. At the side surface 1c of the device main body 1B, a portion of the end face of the upper conductor layer 71 is disposed to be contiguous to a portion of the end face of the lower conductor layer 41.

The upper conductor layer 73 is connected to the wiring portion 43a of the lower conductor layer 43 via the openings 52 and 62. At the side surface 1d of the device main body 1B, a portion of the end face of the upper conductor layer 73 is disposed to be contiguous to a portion of the end face of the lower conductor layer 43.

The upper conductor layer 74 is connected to the lower conductor layer 44 via the openings 53 and 63. At the side surface 1e of the device main body 1B, a portion of the end face of the upper conductor layer 74 is disposed to be contiguous to a portion of the end face of the lower conductor layer 44.

The wiring portion 72a of the upper conductor layer 72 is connected to the lower conductor layer 45 via the openings 54 and 64. At the side surface 1f of the device main body 1B, a portion of the end face of the upper conductor layer 72 is disposed to be contiguous to a portion of the end face of the lower conductor layer 45.

The upper conductor layer 75 is connected to the wiring portion 42a of the lower conductor layer 42 via the openings 55 and 65. The upper conductor layer 76 is connected to the wiring portion 43a of the lower conductor layer 43 via the openings 56 and 66.

The inductor-forming portion 72b of the upper conductor layer 72 is connected to the inductor-forming portion 41b of the lower conductor layer 41 via the openings 57 and 67. The inductor-forming portions 72b and 41b form the inductor 111 of FIG. 6.

The inductor-forming portion 72c of the upper conductor layer 72 is connected to the inductor-forming portion 42b of the lower conductor layer 42 via the openings 58 and 68. The inductor-forming portions 72c and 42b form the inductor 112 of FIG. 6.

The inductor-forming portion 72d of the upper conductor layer 72 is connected to the inductor-forming portion 43b of the lower conductor layer 43 via the openings 59 and 69. The inductor-forming portions 72d and 43b form the inductor 113 of FIG. 6.

A portion of the capacitor-forming portion 72e of the upper conductor layer 72 is disposed in the opening 6C1 and opposed to a portion of the capacitor-forming portion 41c of the lower conductor layer 41 with the dielectric film 5 disposed in between. The dielectric film 5 and these portions of the capacitor-forming portions 72e and 41c form the capacitor 121 of FIG. 6.

A portion of the capacitor-forming portion 72f of the upper conductor layer 72 is disposed in the opening 6C2 and opposed to a portion of the capacitor-forming portion 42c of the lower conductor layer 42 with the dielectric film 5 disposed in between. The dielectric film 5 and these portions of the capacitor-forming portions 72f and 42c form the capacitor 122 of FIG. 6.

A portion of the capacitor-forming portion 72g of the upper conductor layer 72 is disposed in the opening 6C3 and opposed to a portion of the capacitor-forming portion 43c of the lower conductor layer 43 with the dielectric film 5 disposed in between. The dielectric film 5 and these portions of the capacitor-forming portions 72g and 43c form the capacitor 123 of FIG. 6.

A portion of the upper conductor layer 75 is disposed in the opening 6C4 and opposed to a portion of the wiring portion 41a of the lower conductor layer 41 with the dielectric film 5 disposed in between. The dielectric film 5 and these portions of the upper conductor layer 75 and the wiring portion 41a form the capacitor 124 of FIG. 6.

Another portion of the upper conductor layer 75 is disposed in the opening 6C5 and opposed to a portion of the wiring portion 43a of the lower conductor layer 43 with the dielectric film 5 disposed in between. The dielectric film 5 and these portions of the upper conductor layer 75 and the wiring portion 43a form the capacitor 125 of FIG. 6.

A portion of the upper conductor layer 76 is disposed in the opening 6C6 and opposed to another portion of the wiring portion 41a of the lower conductor layer 41 with the dielectric film 5 disposed in between. The dielectric film 5 and these portions of the upper conductor layer 76 and the wiring portion 41a form the capacitor 126 of FIG. 6.

Reference is now made to FIG. 1, FIG. 4 and FIG. 5 to describe the terminal electrodes 11 to 14 in detail. The terminal electrode 11 is disposed to touch part of the side surface 2c of the substrate 2, part of the second surface 2b contiguous to the side surface 2c, and part of the end face of the insulating layer 3 disposed at the side surface 1c of the device main body 1B. Furthermore, the terminal electrode 11 touches part of the end face of the upper conductor layer 71 disposed at the side surface 1c, part of the top surface of the upper conductor layer 71 contiguous to this end face of the upper conductor layer 71, and part of the end face of the lower conductor layer 41 disposed at the side surface 1c. In such a manner, the terminal electrode 11 is connected to the upper conductor layer 71 and the lower conductor layer 41. The terminal electrode 11 is smaller in width than the side surface 1c.

The terminal electrode 12 is disposed to touch part of the side surface 2d of the substrate 2, part of the second surface 2b contiguous to the side surface 2d, and part of the end face of the insulating layer 3 disposed at the side surface 1d of the device main body 1B. Furthermore, the terminal electrode 12 touches part of the end face of the upper conductor layer 73 disposed at the side surface 1d, part of the top surface of the upper conductor layer 73 contiguous to this end face of the upper conductor layer 73, and part of the end face of the lower conductor layer 43 disposed at the side surface 1d. In such a manner, the terminal electrode 12 is connected to the upper conductor layer 73 and the lower conductor layer 43. The terminal electrode 12 is smaller in width than the side surface 1d.

The terminal electrode 13 is disposed to touch part of the side surface 2e of the substrate 2, part of the second surface 2b contiguous to the side surface 2e, and part of the end face of the insulating layer 3 disposed at the side surface 1e of the device main body 1B. Furthermore, the terminal electrode 13 touches part of the end face of the upper conductor layer 74 disposed at the side surface 1e, part of the top surface of the upper conductor layer 74 contiguous to this end face of the upper conductor layer 74, and part of the end face of the lower conductor layer 44 disposed at the side surface 1e. In such a manner, the terminal electrode 13 is connected to the upper conductor layer 74 and the lower conductor layer 44. The terminal electrode 13 is smaller in width than the side surface 1e.

The terminal electrode 14 is disposed to touch part of the side surface 2f of the substrate 2, part of the second surface 2b contiguous to the side surface 2f, and part of the end face of the insulating layer 3 disposed at the side surface 1f of the device main body 1B. Furthermore, the terminal electrode 14 touches part of the end face of the upper conductor layer 72 disposed at the side surface 1f, part of the top surface of the upper conductor layer 72 contiguous to this end face of the upper conductor layer 72, and part of the end face of the lower conductor layer 45 disposed at the side surface 1f. In such a manner, the terminal electrode 14 is connected to the upper conductor layer 72 and the lower conductor layer 45. The terminal electrode 14 is smaller in width than the side surface 1f.

Reference is now made to FIG. 1 to describe the shape of the protection film 8 in detail. The protection film 8 has four concave portions 81 to 84. The concave portions 81 to 84 each have a shape that is recessed inward from the edge of the protection film 8 except portions thereof corresponding to these concave portions. The concave portions 81 to 84 are disposed in regions corresponding to the terminal electrodes 11 to 14, respectively.

The concave portion 81 exposes a portion of the top surface of the upper conductor layer 71 that touches the terminal electrode 11. In addition, the concave portion 81 accommodates a portion of the terminal electrode 11, that is, a portion of the terminal electrode 11 disposed on the top surface of the upper conductor layer 71. The concave portion 82 exposes a portion of the top surface of the upper conductor layer 73 that touches the terminal electrode 12. In addition, the concave portion 82 accommodates a portion of the terminal electrode 12, that is, a portion of the terminal electrode 12 disposed on the top surface of the upper conductor layer 73. The concave portion 83 exposes a portion of the top surface of the upper conductor layer 74 that touches the terminal electrode 13. In addition, the concave portion 83 accommodates a portion of the terminal electrode 13, that is, a portion of the terminal electrode 13 disposed on the top surface of the upper conductor layer 74. The concave portion 84 exposes a portion of the top surface of the upper conductor layer 72 that touches the terminal electrode 14. In addition, the concave portion 84 accommodates a portion of the terminal electrode 14, that is, a portion of the terminal electrode 14 disposed on the top surface of the upper conductor layer 72. The terminal electrodes 11 to 14 do not extend out of the concave portions 81 to 84, respectively, and do not reach over the protection film 8.

In the example shown in FIG. 1, FIG. 4 and FIG. 5, there is no space between respective edges of the concave portions 81 to 84 and the respective portions of the terminal electrodes 11 to 14 disposed in the concave portions 81 to 84. Furthermore, in this example, the top surface of the protection film 8 and the top surfaces of the terminal electrodes 11 to 14 form a contiguous flat surface. In this case, the top surface of the thin-film device 1 is flat. It suffices that portions of the terminal electrodes 11 to 14 are disposed in the concave portions 81 to 84, respectively, and there may be a space between the respective edges of the concave portions 81 to 84 and the respective portions of the terminal electrodes 11 to 14. Furthermore, there may be a difference in level between the top surface of the protection film 8 and the top surface of each of the terminal electrodes 11 to 14.

When the protection film 8 is seen from above, the edge of the protection film 8 except portions corresponding to the concave portions 81 to 84 is located at a position that coincides with the edge of a surface located directly below the protection film 8, that is, the edge of a surface formed by the top surface of the insulating layer 6 and the top surfaces of the upper conductor layer 71 to 76.

Reference is now made to FIG. 5 and FIG. 7 to FIG. 13 to describe a method of manufacturing the thin-film device 1 of the embodiment. FIG. 7 to FIG. 13 are cross-sectional views for describing the method of manufacturing the thin-film device 1. FIG. 7 to FIG. 13 show cross sections corresponding to FIG. 5. Although examples of materials and thicknesses of the layers are given in the following description, those examples are non-limiting for the method of the embodiment.

Figure 7:
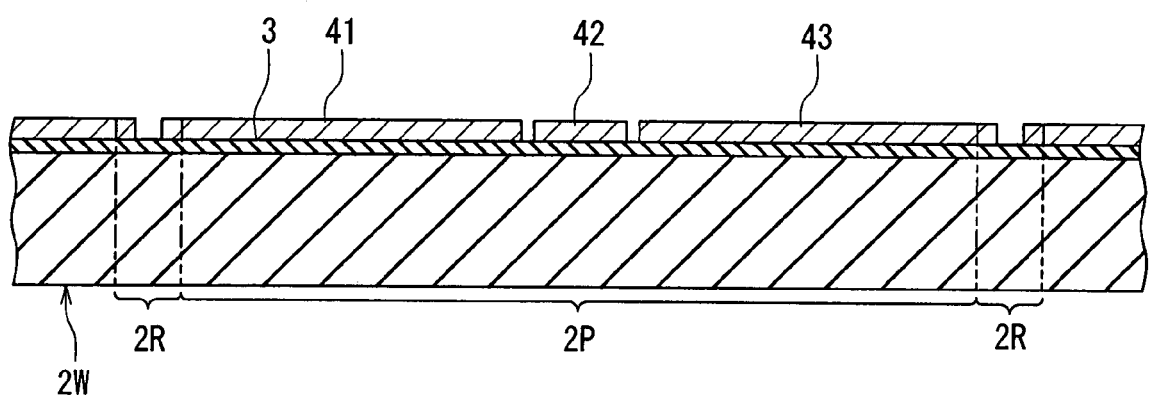
FIG. 7 is a cross-sectional view illustrating a step of a method of manufacturing the thin-film device of the first embodiment of the invention.

FIG. 7 illustrates a step of the method of manufacturing the thin-film device 1. In the step, first, a wafer 2W is prepared. The wafer 2W includes: pre-substrate portions 2P arranged in a plurality of rows; and portions to be removed 2R provided between respective adjacent ones of the pre-substrate portions 2P. The pre-substrate portions 2P are portions each of which will be the substrate 2 later. The portions to be removed 2R are portions that will be removed later by cutting the wafer 2W.

Next, the insulating layer 3 is formed on the wafer 2W. Next, the top surface of the insulating layer 3 is flattened by polishing. A method employed for this polishing may be chemical mechanical polishing (CMP), for example. The polishing is performed so that the thickness of the insulating layer 3 polished will be 2 µm, for example. It is not necessary to flatten the top surface of the insulating layer 3 by polishing if the surface roughness of the top surface of the insulating layer 3 is small enough without flattening the top surface of the insulating layer.

Next, the lower conductor layers 41 to 45 are formed on the insulating layer 3. The lower conductor layers 44 and 45 do not appear in FIG. 7. The lower conductor layers 41, 43, 44 and 45 are formed to extend over regions above the portions to be removed 2R, so that the respective end faces to be connected to the terminal electrodes 11 to 14 will be formed when the wafer 2W is cut later. Every two of the lower conductor layers adjacent to each other across a region above the portions to be removed 2R may be coupled to each other in the region above the portions to be removed 2R.

The lower conductor layers 41 to 45 are formed in the following manner, for example. First, an electrode film is formed on the insulating layer 3 by sputtering, for example. The electrode film will be used as an electrode when a plating film is formed later by electroplating, and will form portions of the lower conductor layers 41 to 45. The electrode film may be a layered film made up of a Ti film having a thickness of 30 nm and a Cu film having a thickness of 100 nm, for example. Next, a photoresist layer having a thickness of 8 µm, for example, is formed on the electrode film. Next, the photoresist layer is patterned by photolithography to form a frame. The frame has grooves having shapes corresponding to the lower conductor layers 41 to 45 to be formed. Next, the plating film is formed in the grooves of the frame by electroplating. The plating film is made of Cu, for example, and has a thickness of 9 to 10 µm, for example. Next, the top surface of the plating film is flattened by polishing. A method employed for this polishing is CMP, for example. The polishing is performed so that the thickness of the plating film polished is 8 µm, for example. Next, the frame is removed. Next, the electrode film except a portion below the plating film is removed by dry etching or wet etching. The lower conductor layers 41 to 45 are thereby formed by the remaining portions of the electrode film and the plating film.

Instead of employing such a process, the lower conductor layers 41 to 45 may be formed by forming an unpatterned plating film on the entire top surfaces of the electrode film and then etching portions of this plating film and the electrode film. Alternatively, the lower conductor layers 41 to 45 may be formed by forming an unpatterned conductor film on the insulating layer 3 by physical vapor deposition such as sputtering or evaporation and then etching a portion of the conductor film.

Figure 8:
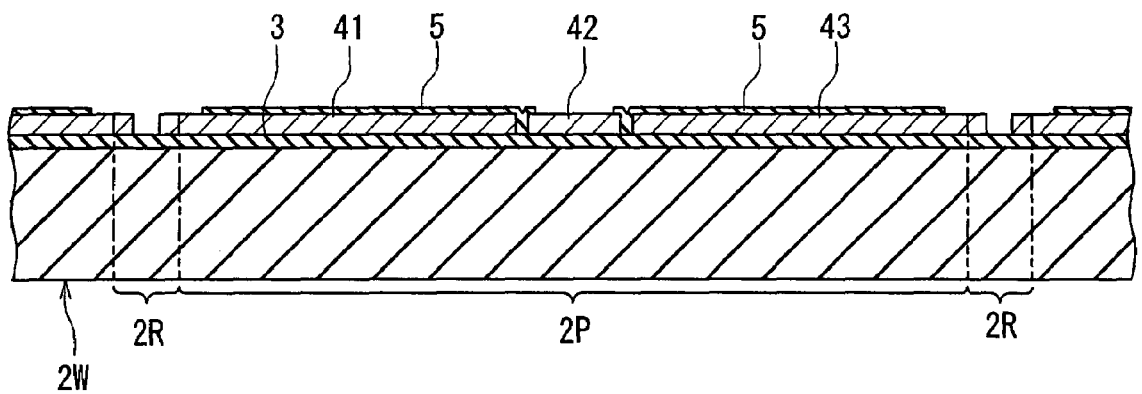
FIG. 8 is a cross-sectional view illustrating a step that follows the step of FIG. 7.

FIG. 8 illustrates the following step. In the step, first, the dielectric film 5 is formed by sputtering, for example, to cover the insulating layer 3 and the lower conductor layers 41 to 45. The dielectric film 5 is formed to have a thickness of 0.1 µm, for example. Next, a photoresist layer is formed on the dielectric film 5. The photoresist layer is then patterned by photolithography to form a plurality of openings in the photoresist layer. The openings are formed at locations corresponding to the openings 51 to 59 to be formed in the dielectric film 5. Next, portions of the dielectric film 5 corresponding to the plurality of openings of the photoresist layer are removed by ashing or etching. The openings 51 to 59 are thereby formed in the dielectric film 5. Next, the photoresist layer is removed.

Figure 9:
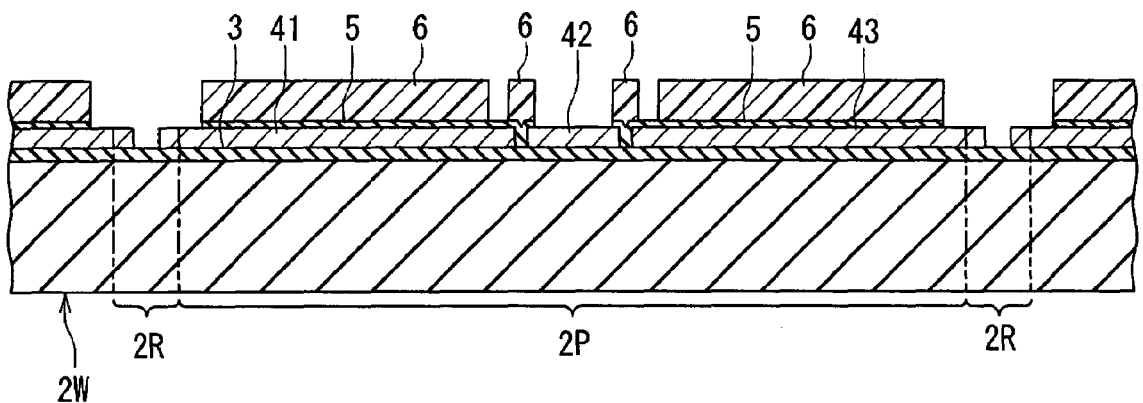
FIG. 9 is a cross-sectional view illustrating a step that follows the step of FIG. 8.

Next, as shown in FIG. 9, the insulating layer 6 is formed on the dielectric film 5. The insulating layer 6 has the openings 61 to 69 and 6C1 to 6C6. If a photosensitive resin is used as the material of the insulating layer 6, the insulating layer 6 is patterned by photolithography. If a material other than a photosensitive resin is used as the material of the insulating layer 6, the insulating layer 6 is patterned by selective etching, for example.

Figure 10:
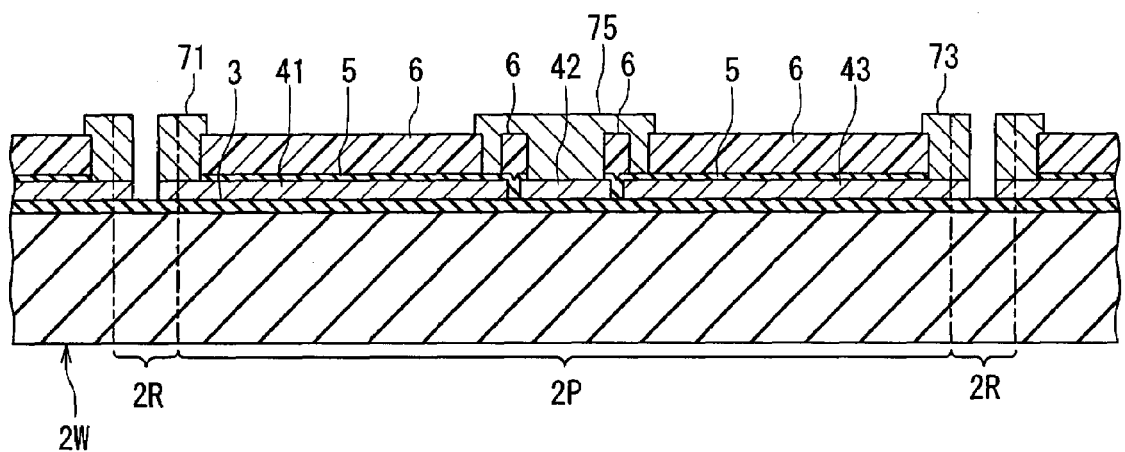
FIG. 10 is a cross-sectional view illustrating a step that follows the step of FIG. 9.

FIG. 10 illustrates the following step. In the step, the upper conductor layers 71 to 76 are formed. In FIG. 10 the upper conductor layers 72, 74 and 76 do not appear. The upper conductor layers 71, 73, 74 and 72 are formed to extend over regions above the portions to be removed 2R, so that the respective end faces to be connected to the terminal electrodes 11 to 14 will be formed when the wafer 2W is cut later. Every two of the upper conductor layers adjacent to each other across a region above the portions to be removed 2R may be coupled to each other in the region above the portions to be removed 2R. The method of forming the upper conductor layers 71 to 76 is the same as that of the lower conductor layers 41 to 45.

Figure 11:
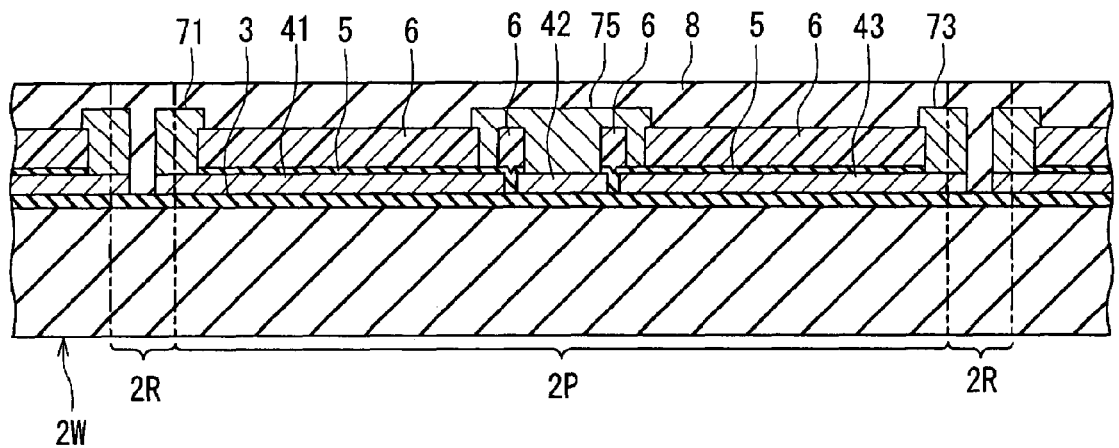
FIG. 11 is a cross-sectional view illustrating a step that follows the step of FIG. 10.

Next, as shown in FIG. 11, the protection film 8 is formed to cover the insulating layer 6 and the upper conductor layers 71 to 76. At this point, the concave portions 81 to 84 are not formed in the protection film 8 yet.

Figure 12:
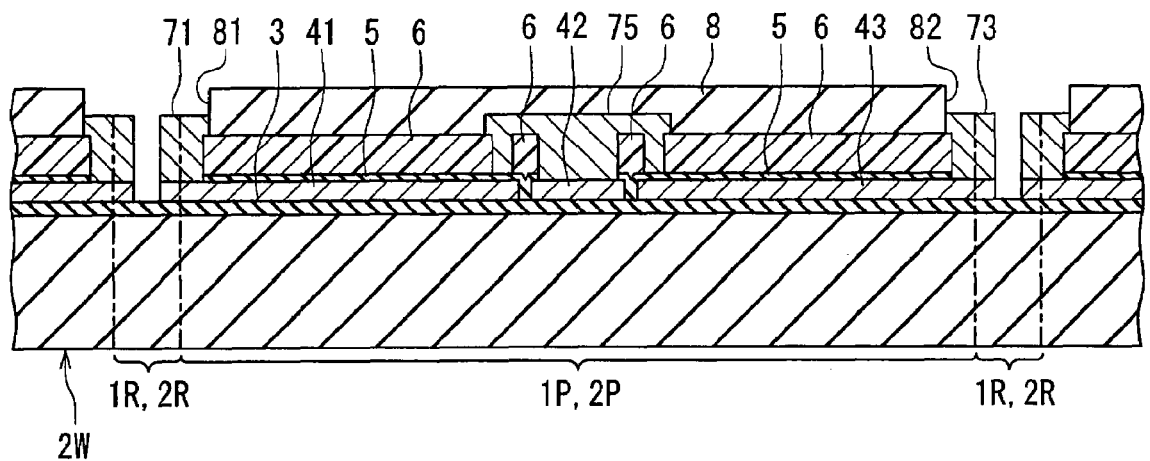
FIG. 12 is a cross-sectional view illustrating a step that follows the step of FIG. 11.

Next, as shown in FIG. 12, the protection film 8 is processed so as to remove portions of the protection film 8 located in the respective regions above the portions to be removed 2R, and also to remove portions of the protection film 8 corresponding to the concave portions 81 to 84. The concave portions 81 to 84 are thereby formed in the protection film 8. The protection film 8 may be processed by laser processing, etching using plasma, or processing using a dicing saw, for example. If a photosensitive resin is used as the material of the protection film 8, the protection film 8 may be processed by photolithography. Here, the layered structure made up of the layers from the wafer 2W to the protection film 8 fabricated through the foregoing steps is called a thin-film device substructure. The substructure includes: a plurality of preliminary device main body portions 1P that will be the respective device main bodies 1B; and portions to be removed 1R disposed between respective adjacent ones of the preliminary device main body portions 1P. The preliminary device main body portions 1P are made up of the pre-substrate portions 2P and portions thereabove of the substructure. The portions to be removed 1R are made up of the portions to be removed 2R and portions thereabove of the substructure.

Figure 13:
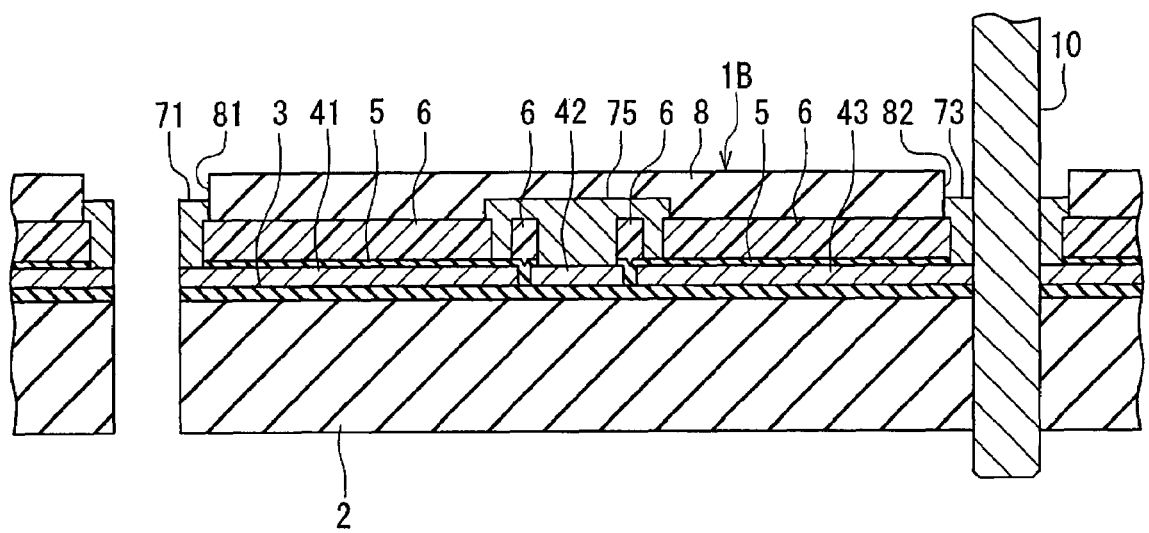
FIG. 13 is a cross-sectional view illustrating a step that follows the step of FIG. 12.

Next, as shown in FIG. 13, the substructure is cut with a dicing saw, for example, at the locations of the portions to be removed 1R. As a result, the portions 1R of the substructure are removed, and the plurality of preliminary device main body portions 1P are separated. The preliminary device main body portions 1P separated become the device main bodies 1B. By cutting the substructure, there are formed the end faces of the lower conductor layers 41, 43, 44 and 45 and the end faces of the upper conductor layers 71, 73, 74 and 72 that will be connected to the terminal electrodes 11 to 14. In FIG. 13, numeral 10 indicates the blade of the dicing saw.

Next, as shown in FIG. 5, the terminal electrodes 11 to 14 are formed at specific locations of the device main bodies 1B. The terminal electrodes 11 to 14 are formed in the following manner, for example. First, a base electrode film is formed at a specific location of each of the device main bodies 1B. The base electrode film may be formed by applying a conductive resin or a conductive paste to the specific location of the device main body 1B by screen printing or transfer and then drying and hardening the resin or paste. Alternatively, a base electrode film made of a conductive film may be formed by forming a mask having an opening at a specific location on the device main body 1B, forming a conductive film by sputtering, for example, on the mask and in the opening, and then removing the mask. The conductive film used in this case may be a layered film made up of a Cr film and a Cu film, a layered film made up of a Ti film and a Cu film, or a layered film made up of an Ni film and a Cu film, for example. Next, a plating film is formed on the base electrode film by barrel plating, for example. The plating film may be a layered film made up of a first film of Ni or Ti and a second film of Sn or Au, or a layered film made up of a first film of Cu, a second film of Ni or Ti, and a third film of Sn or Au, for example.

The method of forming the terminal electrodes 11 to 14 is not limited to the above-described method. For example, the terminal electrodes 11 to 14 may be formed by applying a conductive resin or a conductive paste to the specific locations of the device main body 1B by screen printing or transfer and then drying and hardening the resin or paste.

Effects of the thin-film device 1 of the embodiment will now be described. In the following description the lower conductor layers 41 to 45 are represented by a lower conductor layer 4, and the upper conductor layers 71 to 76 are represented by an upper conductor layer 7. In the thin-film device 1 of the embodiment, the terminal electrodes 11 to 14 touch respective portions of the end faces of the upper conductor layer 7, and respective portions of the top surface of the upper conductor layer 7 contiguous to the end faces. As a result, according to the embodiment, it is possible to increase the areas of the regions in which the upper conductor layer 7 touches the terminal electrodes 11 to 14, and it is thereby possible to enhance the reliability of connection between the upper conductor layer 7 and the terminal electrodes 11 to 14.

In the embodiment, the protection film 8 has the four concave portions 81 to 84. The concave portions 81 to 84 each have a shape that is recessed inward from the edge of the protection film 8 except the portions corresponding to these concave portions. The concave portions 81 to 84 expose the respective portions of the top surface of the upper conductor layer 7 that touch the terminal electrodes 11 to 14, and accommodate respective portions of the terminal electrodes 11 to 14. Therefore, the concave portions 81 to 84 have a function of defining the shapes and locations of the terminal electrodes 11 to 14. As a result, according to the embodiment, it is possible to suppress variations in shapes and locations of the terminal electrodes 11 to 14. It is thereby possible to prevent variations in electrical characteristics of the thin-film device 1 resulting from variations in magnitude of electromagnetic coupling or capacitive coupling between the terminal electrodes 11 to 14 and the conductor layers of the device main body 1B. Furthermore, according to the embodiment, it is possible to prevent variations in electrical characteristics of the thin-film device 1 or an occurrence of short-circuit between adjacent ones of the terminal electrodes resulting from variations in distance between the respective adjacent ones of the terminal electrodes.

In the embodiment, at each of the side surfaces 1c to 1f of the device main body 1B, the end faces of the lower conductor layer 4 and the upper conductor layer 7 are disposed to be contiguous to each other. In addition, at the side surfaces 1c to 1f, the terminal electrodes 11 to 14 touch respective portions of the end faces of the lower conductor layer 4 and respective portions of the end faces of the upper conductor layer 7. As a result, according to the embodiment, it is possible to increase the area of the regions in which the terminal electrodes 11 to 14 touch the conductor layers 4 and 7 connected to the terminal electrodes 11 to 14, and it is thereby possible to enhance the reliability of connection between the terminal electrodes 11 to 14 and the conductor layers 4 and 7.

At each of the side surfaces 1c to 1f of the device main body 1B, if the end faces of the lower conductor layer 4 and the upper conductor layer 7 are not disposed to be contiguous to each other, the end face of the insulating layer 6 would exist between the end faces of the lower conductor layer 4 and the upper conductor layer 7. Compared with this case, the number of interfaces of the layers or films appearing at the side surfaces 1c to 1f is smaller in the embodiment since the end faces of the lower conductor layer 4 and the upper conductor layer 7 are contiguous to each other. As a result, according to the embodiment, it is possible to reduce occurrences of defects such as peeling or chipping of layers or films when the thin-film device substructure is cut.

Figure 14:
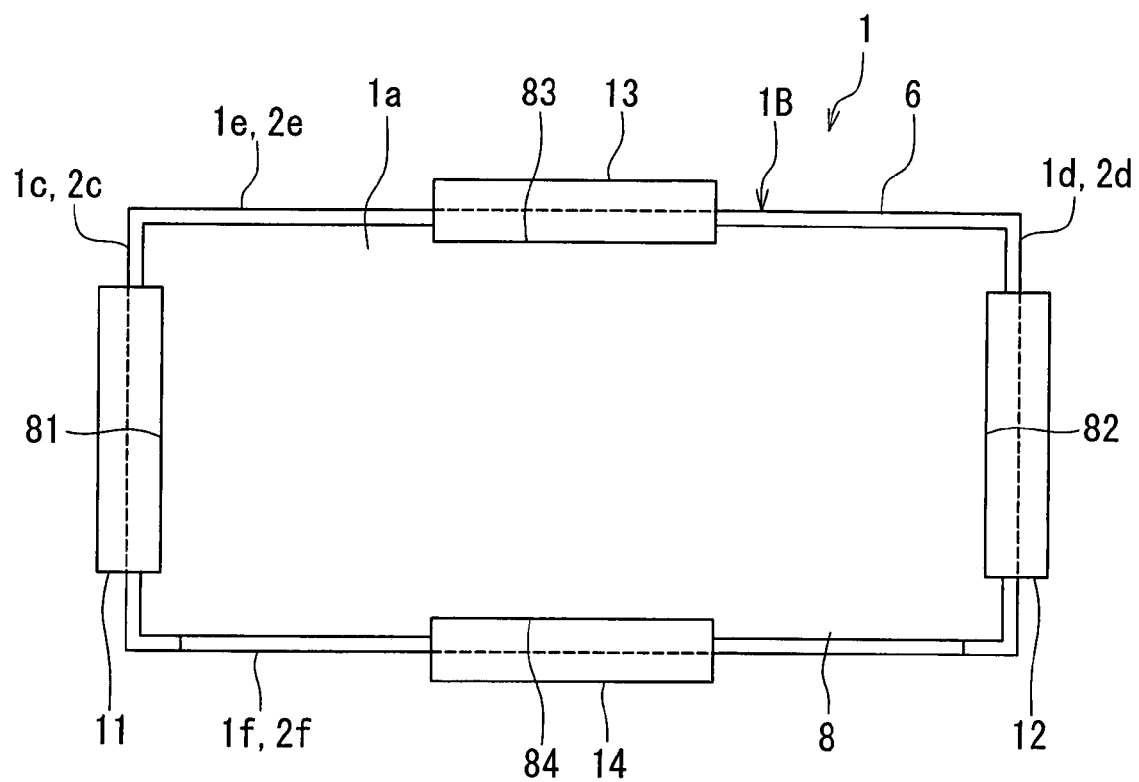
FIG. 14 is a top view of a thin-film device of a first modification example of the first embodiment of the invention.

Reference is now made to FIG. 14 to FIG. 20 to describe first to seventh modification examples of the first embodiment. FIG. 14 is a top view of the thin-film device 1 of the first modification example. In the thin-film device 1 of the first modification example, when the protection film 8 is seen from above, the edge of the protection film 8 except portions corresponding to the concave portions 81 to 84 is located on an inner side relative to the edge of the surface located directly below the protection film 8, that is, the edge of the surface formed by the top surface of the insulating layer 6 and the top surfaces of the upper conductor layers 71 to 76. The remainder of configuration, function and effects of the thin-film device 1 of the first modification example are the same as those of the thin-film device 1 shown in FIG. 1 to FIG. 6.

Figure 15:
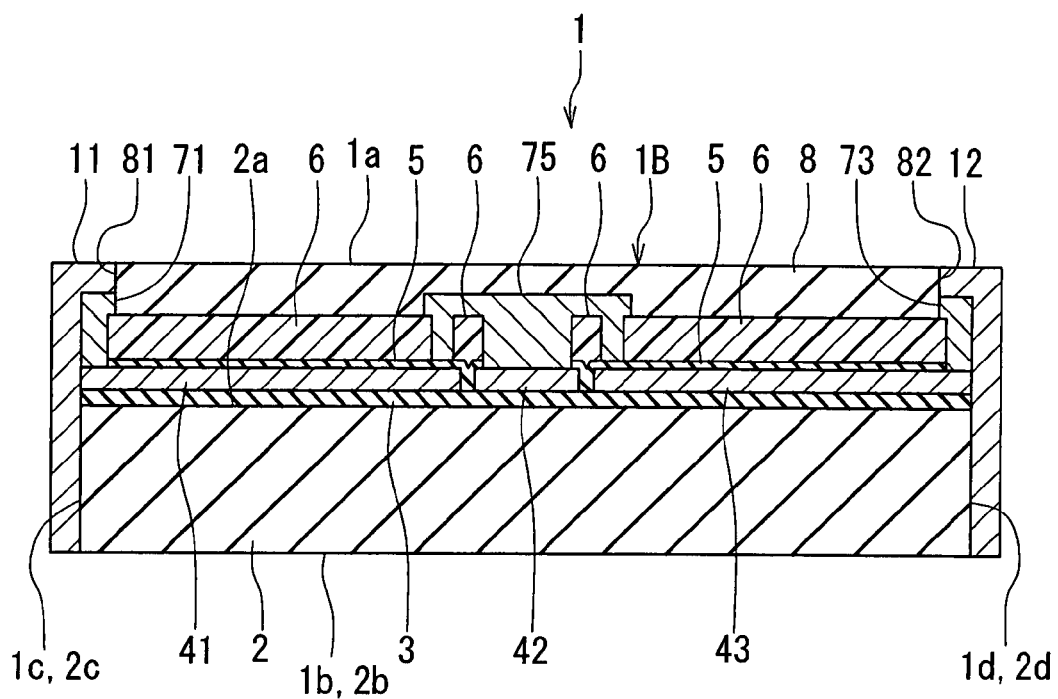
FIG. 15 is a cross-sectional view of a thin-film device of a second modification example of the first embodiment of the invention.

FIG. 15 is a cross-sectional view of the thin-film device 1 of the second modification example. FIG. 15 shows a cross section corresponding to FIG. 5. In the thin-film device 1 of the second modification example, the terminal electrodes 11 to 14 do not touch the second surface 2b of the substrate 2. The lower end faces of the terminal electrodes 11 to 14, together with the second surface 2b, form a contiguous flat surface. In the second modification example, it is possible that each of the bottom and top surfaces of the thin-film device 1 is made a flat one. The remainder of configuration, function and effects of the thin-film device 1 of the second modification example are the same as those of the thin-film device 1 shown in FIG. 1 to FIG. 6.

Figure 16:
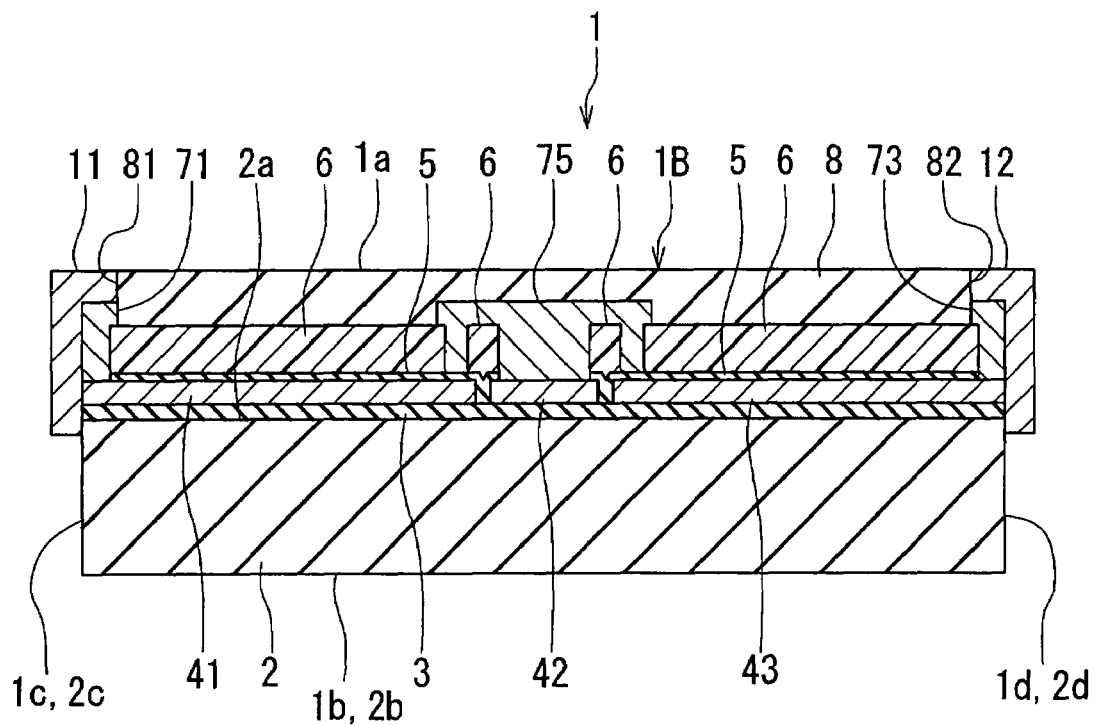
FIG. 16 is a cross-sectional view of a thin-film device of a third modification example of the first embodiment of the invention.

FIG. 16 is a cross-sectional view of the thin-film device 1 of the third modification example. FIG. 16 shows a cross section corresponding to FIG. 5. In the thin-film device 1 of the third modification example, the lower end faces of the terminal electrodes 11 to 14 are located at a level between the first surface 2a and the second surface 2b of the substrate 2. Consequently, the terminal electrodes 11 to 14 do not touch the second surface 2b of the substrate 2. In the third modification example, it is possible that each of the bottom and top surfaces of the thin-film device 1 is made a flat one. The remainder of configuration, function and effects of the thin-film device 1 of the third modification example are the same as those of the thin-film device 1 shown in FIG. 1 to FIG. 6.

Figure 17:
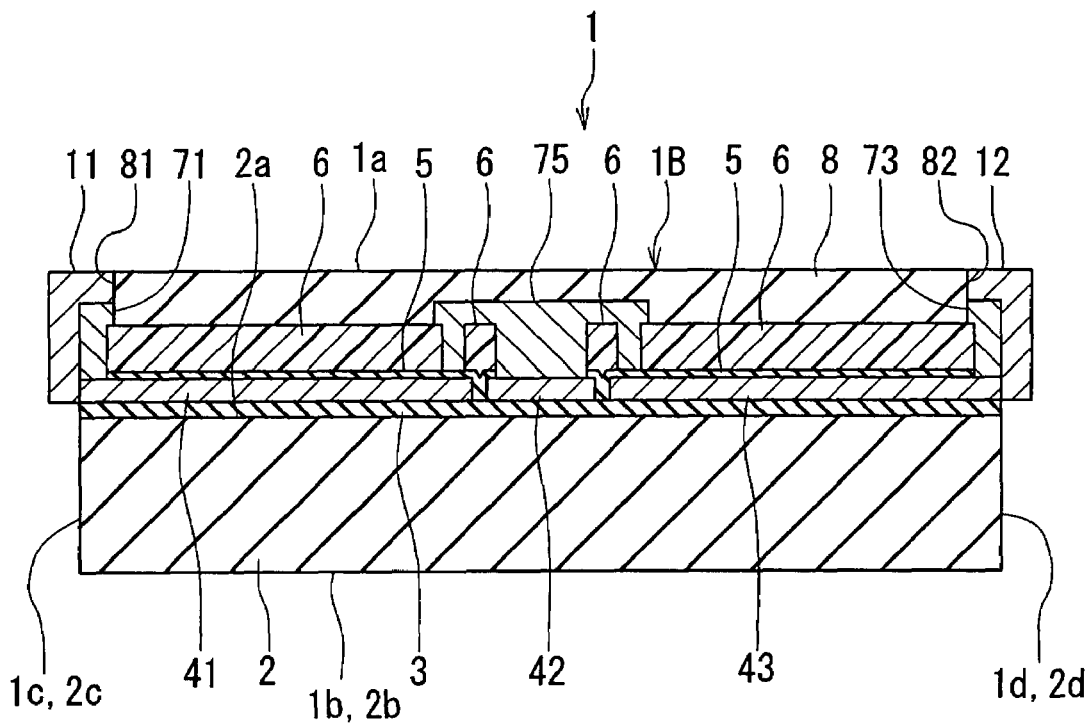
FIG. 17 is a cross-sectional view of a thin-film device of a fourth modification example of the first embodiment of the invention.

FIG. 17 is a cross-sectional view of the thin-film device 1 of the fourth modification example. FIG. 17 shows a cross section corresponding to FIG. 5. In the thin-film device 1 of the fourth modification example, the lower end faces of the terminal electrodes 11 to 14 are located at the level of the interface between the insulating layer 3 and the lower conductor layers 41, 43, 44 and 45. Consequently, the terminal electrodes 11 to 14 do not touch the end face of the insulating layer 3 and the side surfaces 2c to 2f and the second surface 2b of the substrate 2. In the fourth modification example, it is possible that each of the bottom and top surfaces of the thin-film device 1 is made a flat one. The remainder of configuration, function and effects of the thin-film device 1 of the fourth modification example are the same as those of the thin-film device 1 shown in FIG. 1 to FIG. 6.

Figure 18:
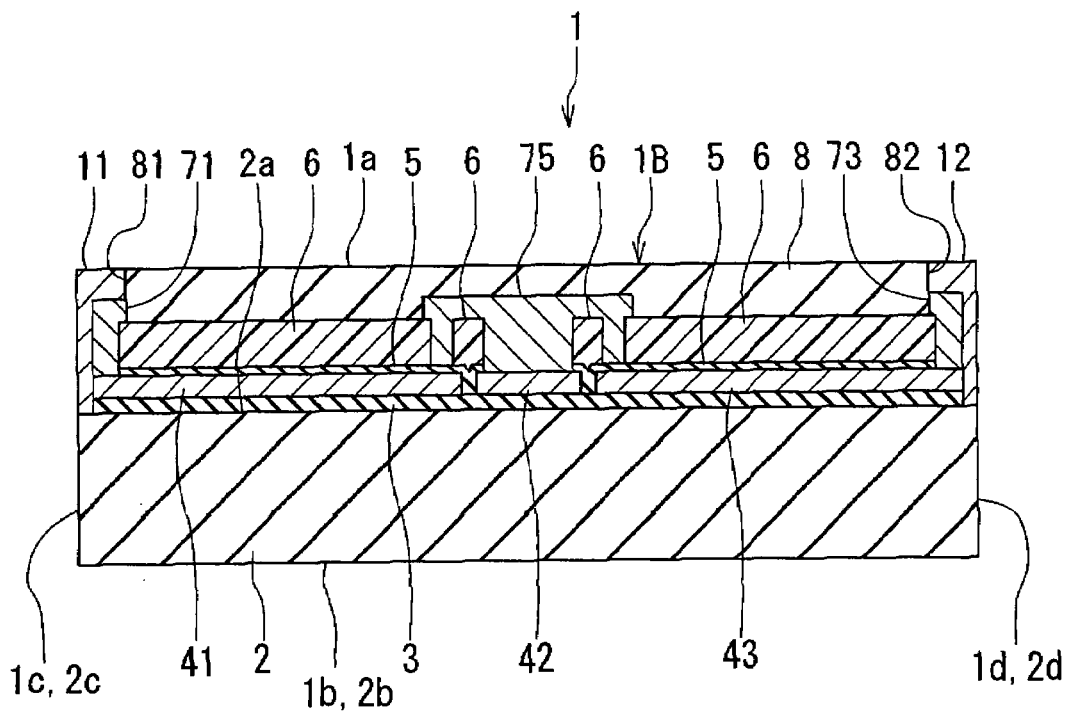
FIG. 18 is a cross-sectional view of a thin-film device of a fifth modification example of the first embodiment of the invention.

FIG. 18 is a cross-sectional view of the thin-film device 1 of the fifth modification example. FIG. 18 shows a cross section corresponding to FIG. 5. In the thin-film device 1 of the fifth modification example, when the device main body 1B is seen from above, the edge of the insulating layer 3 is located on an inner side relative to the edge of the first surface 2a of the substrate 2. Therefore, part of the first surface 2a near the edge thereof is not covered with the insulating layer 3. In addition, when the device main body 1B is seen from above, the end faces of the lower conductor layers 41, 43, 44 and 45 and the end faces of the upper conductor layers 71, 73, 74 and 72 disposed at the side surfaces 1c to 1f of the device main body 1B are located at positions that coincide with the edge of the insulating layer 3. As a result, differences in level are created in the side surfaces 1c to 1f of the device main body 1B, so that the side surfaces 2c to 2f of the substrate 2, that is, portions below the level of the interface between the substrate 2 and the insulating layer 3, protrude more outward in a lateral direction than portions above the level of the interface between the substrate 2 and the insulating layer 3. The lower end faces of the terminal electrodes 11 to 14 touch part of the first surface 2a. The terminal electrodes 11 to 14 do not touch the side surfaces 2c to 2f and the second surface 2b of the substrate 2.

In a method of manufacturing the thin-film device 1 of the fifth modification example, after the step illustrated in FIG. 12, shallow recessing is performed on the thin-film device substructure at the locations of the portions to be removed 1R. In this shallow recessing, portions of the upper conductor layers 71, 73, 74 and 72, portions of the lower conductor layers 41, 43, 44 and 45, and portions of the insulating layer 3 are removed in a region wider than the width of the portions to be removed 1R. Shallow recesses are thereby formed in the thin-film device substructure. The shallow recessing may be performed by laser processing or processing using a dicing saw, for example. After this step, as in the step shown in FIG. 13, the substructure is cut at the locations of the portions to be removed 1R. As a result, the differences in level described previously are formed in the side surfaces 1c to 1f of the device main body 1B. Then, the terminal electrodes 11 to 14 are formed as shown in FIG. 18.

The thin-film device 1 of the fifth modification example may be formed by a method that will now be described. In this method, after shallow recesses are formed in the substructure as described above, conductor layers that will be the terminal electrodes 11 to 14 later are formed in the shallow recesses. These conductor layers and the substructure are then cut at the locations of the portions to be removed 1R. The terminal electrodes 11 to 14 are thereby formed by these conductor layers that have been cut.

In the fifth modification example, it is possible to make each of the bottom and top surfaces of the thin-film device 1 flat. In addition, it is possible to make each of the side surfaces 1c to 1f of the device main body 1B nearly flat. The remainder of configuration, function and effects of the thin-film device 1 of the fifth modification example are the same as those of the thin-film device 1 shown in FIG. 1 to FIG. 6.

Figure 19:
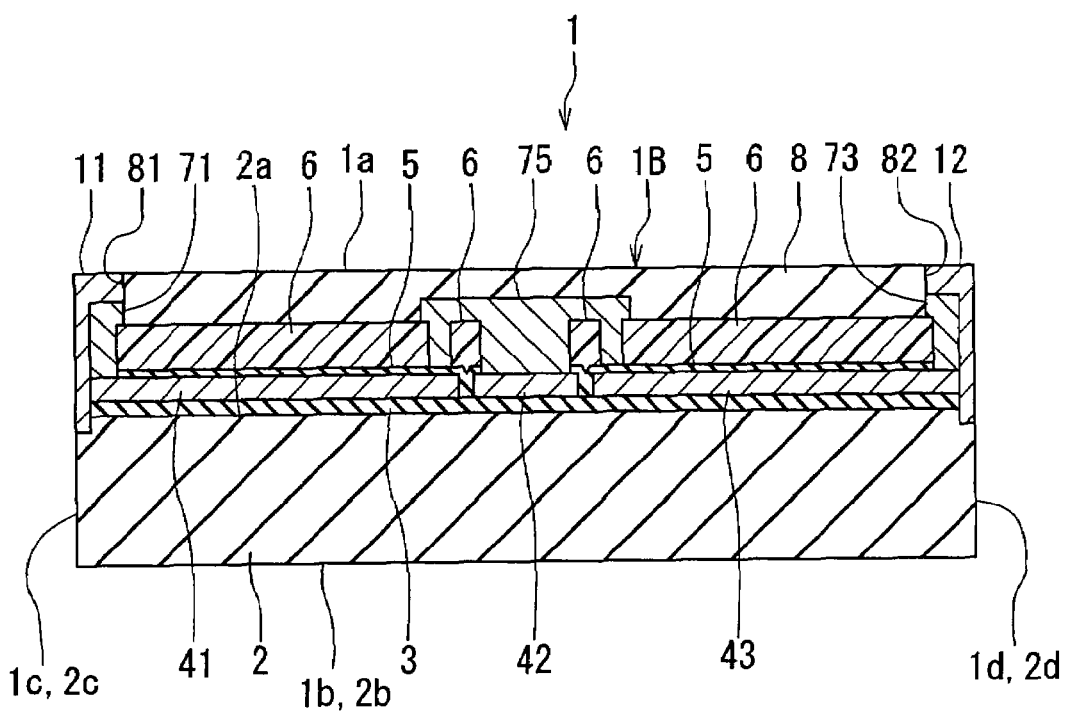
FIG. 19 is a cross-sectional view of a thin-film device of a sixth modification example of the first embodiment of the invention.

FIG. 19 is a cross-sectional view of the thin-film device 1 of the sixth modification example. FIG. 19 shows a cross section corresponding to FIG. 5. In the thin-film device 1 of the sixth modification example, differences in level are created in the side surfaces 2c to 2f of the substrate 2, so that portions below a specific level between the first surface 2a and the second surface 2b protrude more outward in a lateral direction than portions above this level. When the device main body 1B is seen from above, the edge of the insulating layer 3 is located at a position that coincides with the edge of the first surface 2a of the substrate 2. Furthermore, when the device main body 1B is seen from above, the end faces of the lower conductor layers 41, 43, 44 and 45 and the end faces of the upper conductor layers 71, 73, 74 and 72 disposed at the side surfaces 1c to 1f of the device main body 1B are located at positions that coincide with the edge of the insulating layer 3. As a result, differences in level are created in the side surfaces 1c to 1f of the device main body 1B, so that portions below the above-mentioned specific level protrude more outward in a lateral direction than portions above this level. The lower end faces of the terminal electrodes 11 to 14 are located at this specific level. The terminal electrodes 11 to 14 touch portions of the side surfaces 2c to 2f of the substrate 2 located above this specific level. The terminal electrodes 11 to 14 do not touch the second surface 2b of the substrate 2.

In a method of manufacturing the thin-film device 1 of the sixth modification example, after the step illustrated in FIG. 12, half-cut processing is performed on the thin-film device substructure at the locations of the portions to be removed 1R. In this half-cut processing, portions of the upper conductor layers 71, 73, 74 and 72, portions of the lower conductor layers 41, 43, 44 and 45, and portions of the insulating layer 3 are removed in a region wider than the width of the portions to be removed 1R, and a portion of the wafer 2W above the above-mentioned specific level is removed to form grooves in the substructure. The half-cut processing may be performed by processing using a dicing saw, for example. After this step, as in the step shown in FIG. 13, the substructure is cut at the locations of the portions to be removed 1R. As a result, the differences in level described previously are formed in the side surfaces 1c to 1f of the device main body 1B. Then, the terminal electrodes 11 to 14 are formed as shown in FIG. 19.

Alternatively, the thin-film device 1 of the sixth modification example may be formed by a method that will now be described. In this method, after the grooves are formed in the substructure as described above, conductor layers that will be the terminal electrodes 11 to 14 later are formed in the grooves. These conductor layers and the substructure are then cut at the locations of the portions to be removed 1R. The terminal electrodes 11 to 14 are thereby formed by these conductor layers that have been cut.

In the sixth modification example, each of the bottom and top surfaces of the thin-film device 1 is made flat. In addition, it is possible to make each of the side surfaces $1c$ to $1f$ of the device main body 1B nearly flat. The remainder of configuration, function and effects of the thin-film device 1 of the sixth modification example are the same as those of the thin-film device 1 shown in FIG. 1 to FIG. 6.

Figure 20:
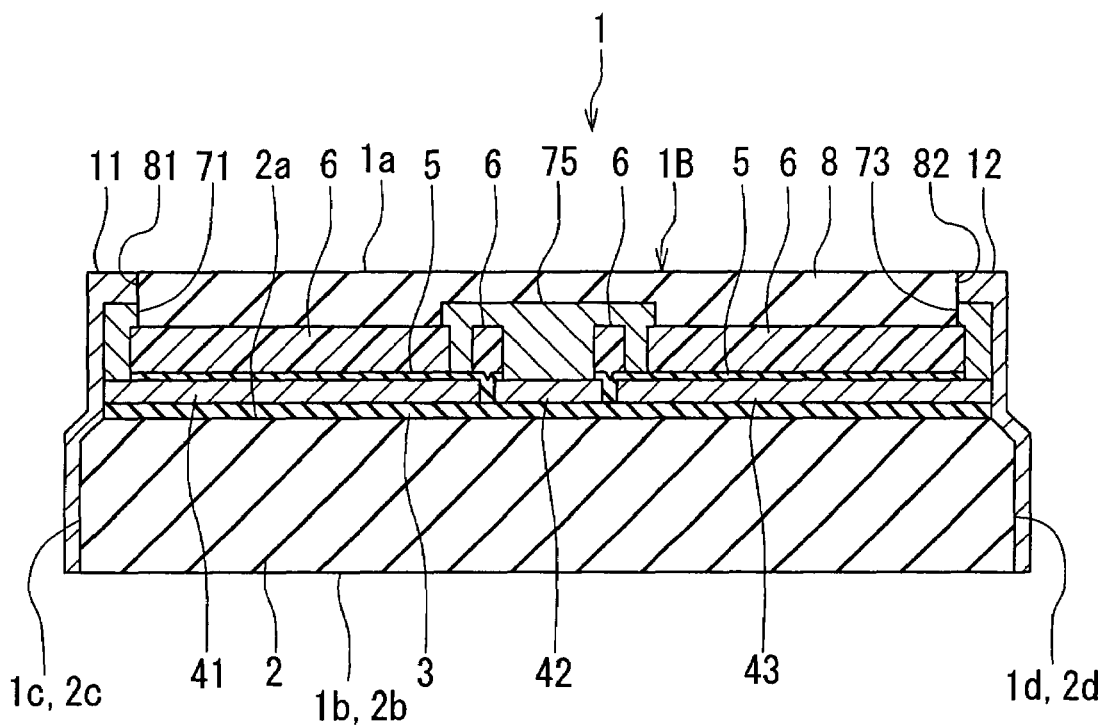
FIG. 20 is a cross-sectional view of a thin-film device of a seventh modification example of the first embodiment of the invention.

FIG. 20 is a cross-sectional view of the thin-film device 1 of the seventh modification example. FIG. 20 shows a cross section corresponding to FIG. 5. In the thin-film device 1 of the seventh modification example, in a portion of the substrate 2 above a specific level between the first surface $2a$ and the second surface $2b$, the area of the cross section parallel to the first surface $2a$ gradually decreases as the distance from the first surface $2a$ decreases. In addition, portions of the side surfaces $2c$ to $2f$ of the substrate 2 located above this specific level form sloped surfaces. When the device main body 1B is seen from above, the edge of the insulating layer 3 is located at a position that coincides with the edge of the first surface $2a$ of the substrate 2. Furthermore, when the device main body 1B is seen from above, the end faces of the lower conductor layers 41, 43, 44 and 45 and the end faces of the upper conductor layers 71, 73, 74 and 72 disposed at the side surfaces $1c$ to $1f$ of the device main body 1B are located at positions that coincide with the edge of the insulating layer 3. The terminal electrodes 11 to 14 do not touch the second surface $2b$ of the substrate 2. The lower end faces of the terminal electrodes 11 to 14, together with the second surface $2b$, form a contiguous flat surface.

In a method of manufacturing the thin-film device 1 of the seventh modification example, after the step illustrated in FIG. 12, shallow recessing is performed on the thin-film device substructure at the locations of the portions to be removed 1R. In this shallow recessing, portions of the upper conductor layers 71, 73, 74 and 72, portions of the lower conductor layers 41, 43, 44 and 45, and portions of the insulating layer 3 are removed in a region wider than the width of the portions to be removed 1R, and a portion of the wafer 2W above the above-mentioned specific level is removed in part so as to form a surface of the wafer 2W that will be the above-mentioned sloped surfaces later. Shallow recesses are thereby formed in the thin-film device substructure. The shallow recessing may be performed by laser processing or processing using a dicing saw, for example. After this step, as in the step shown in FIG. 13, the substructure is cut at the locations of the portions to be removed 1R. As a result, the above-mentioned sloped surfaces are formed at the side surfaces $2c$ to $2f$ of the substrate 2. Then, the terminal electrodes 11 to 14 are formed as shown in FIG. 20.

Alternatively, the thin-film device 1 of the seventh modification example may be formed by a method that will now be described. In this method, after shallow recesses are formed in the substructure as described above, conductor layers that will be the terminal electrodes 11 to 14 later are formed in the shallow recesses. These conductor layers and the substructure are then cut at the locations of the portions to be removed 1R. The terminal electrodes 11 to 14 are thereby formed by these conductor layers that have been cut.

In the seventh modification example, each of the bottom and top surfaces of the thin-film device 1 is made flat. The remainder of configuration, function and effects of the thin-film device $1f$ the seventh modification example are the same as those of the thin-film device 1 shown in FIG. 1 to FIG. 6.

Second Embodiment

A thin-film device of a second embodiment of the invention will now be described. The thin-film device of the second embodiment has a circuit configuration the same as that of the first embodiment.

Figure 21:
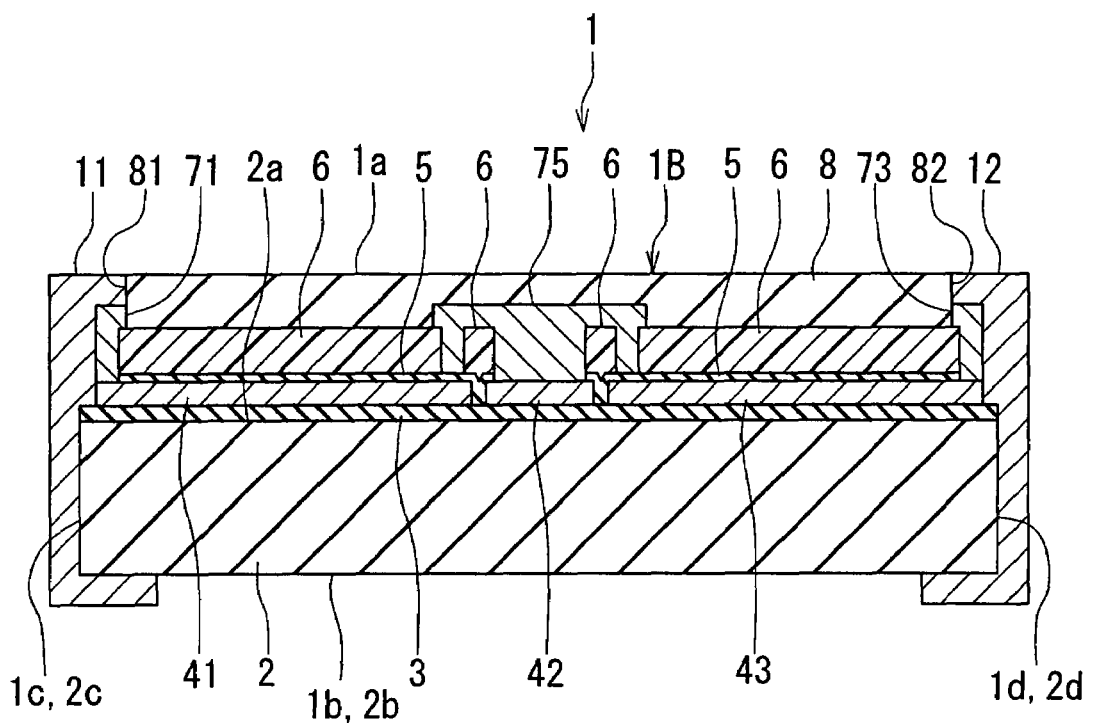
FIG. 21 is a cross-sectional view of a thin-film device of a second embodiment of the invention.

FIG. 21 is a cross-sectional view of the thin-film device of the second embodiment, which shows a cross section corresponding to FIG. 5. In the thin-film device 1 of the second embodiment, when the device main body 1B is seen from above, the end faces of the lower conductor layers 41, 43, 44 and 45 and the end faces of the upper conductor layers 71, 73, 74 and 72 disposed at the side surfaces $1c$ to $1f$ of the device main body 1B are located on an inner side relative to the edge of the insulating layer 3. As a result, differences in level are created in the side surfaces $1c$ to $1f$ of the device main body 1B, so that portions below the level of the top surface of the insulating layer 3 protrude more outward in a lateral direction than portions above this level. In the second embodiment, the terminal electrodes 11 to 14 touch portions of the top surface of the insulating layer 3.

Figure 22:
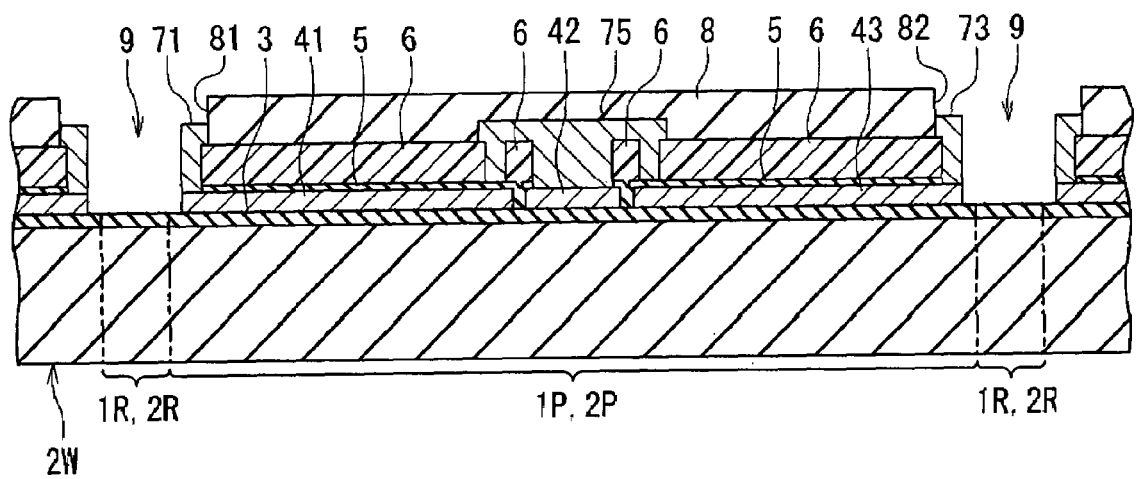
FIG. 22 is a cross-sectional view illustrating a step of a method of manufacturing the thin-film device of the second embodiment of the invention.
Figure 23:
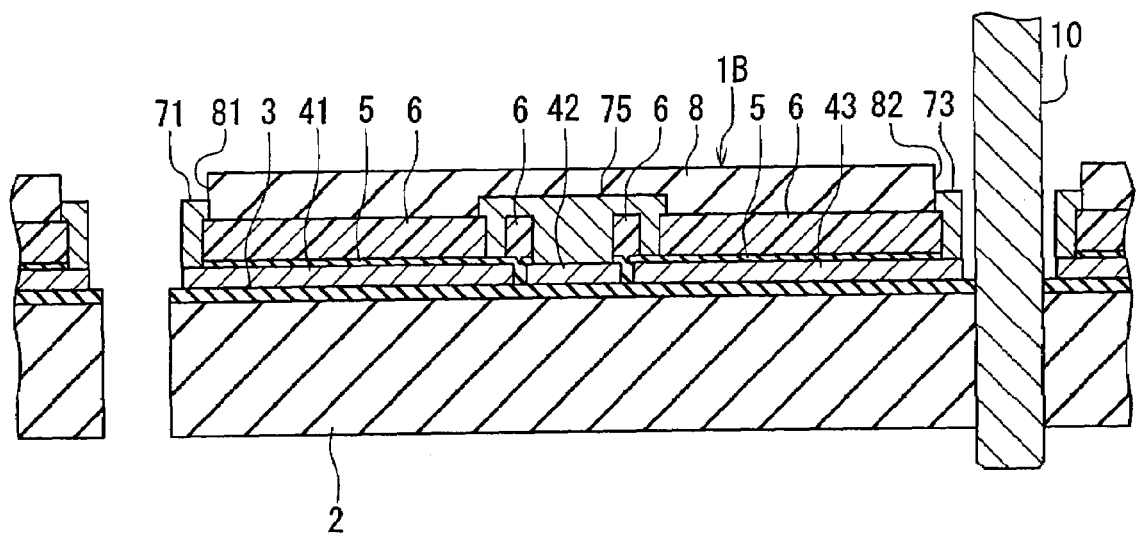
FIG. 23 is a cross-sectional view illustrating a step that follows the step of FIG. 22.

Reference is now made to FIG. 21 to FIG. 23 to describe a method of manufacturing the thin-film device 1 of the second embodiment. FIG. 22 and FIG. 23 are cross-sectional views for describing the method of manufacturing the thin-film device 1 of the second embodiment. FIG. 22 and FIG. 23 show cross sections corresponding to FIG. 21. The method of the second embodiment includes the steps up to the step of fabricating the thin-film device substructure, as shown in FIG. 12, that are the same as those of the first embodiment.

FIG. 22 illustrates the following step. In the step, shallow recessing is performed on the thin-film device substructure at the locations of the portions to be removed 1R. In this shallow recessing, portions of the upper conductor layers 71, 73, 74 and 72 and portions of the lower conductor layers 41, 43, 44 and 45 are removed in a region wider than the width of the portions to be removed 1R. The shallow recesses 9 are thereby formed in the thin-film device substructure. As a result, the end faces to be connected to the terminal electrodes 11 to 14 are formed in the lower conductor layers 41, 43, 44 and 45 and the upper conductor layers 71, 73, 74 and 72. The shallow recessing may be performed by laser processing or processing using a dicing saw, for example.

Alternatively, the upper conductor layers 71, 73, 74 and 72 and the lower conductor layers 41, 43, 44 and 45 may be formed in advance into the shapes that would be obtained by undergoing the shallow recessing, and the protection film 8 may be formed in the regions to be removed by the shallow recessing. In this case, the shallow recesses 9 can be formed by removing the protection film 8 in these regions when the protection film 8 is processed in the step shown in FIG. 12.

Next, as shown in FIG. 23, the substructure is cut at the locations of the portions to be removed 1R, as in the step shown in FIG. 13. As a result, the differences in level described previously are formed in the side surfaces $1c$ to $1f$ of the device main body 1B. Then, the terminal electrodes 11 to 14 are formed as shown in FIG. 21.

In the second embodiment, since the differences in level are formed in the side surfaces $1c$ to $1f$ of the device main body 1B, it is possible that the areas of the regions in which the terminal electrodes 11 to 14 touch the side surfaces $1c$ to 1f are made greater than those of the first embodiment. According to the second embodiment, it is thereby possible to enhance the strength of bonding of the terminal electrodes 11 to 14 to the device main body 1B.

The remainder of configuration, function and effects of the thin-film device 1 of the second embodiment are the same as those of the thin-film device 1 of the first embodiment shown in FIG. 1 to FIG. 6.

In the second embodiment, too, as in the first modification example of the first embodiment, when the protection film 8 is seen from above, the edge of the protection film 8 except the portions corresponding to the concave portions 81 to 84 may be located on an inner side relative to the edge of the surface located directly below the protection film 8, that is, the edge of the surface formed by the top surface of the insulating layer 6 and the top surfaces of the upper conductor layers 71 to 76.

Reference is now made to FIG. 24 to FIG. 27 to describe first to fourth modification examples of the second embodiment.

Figure 24:
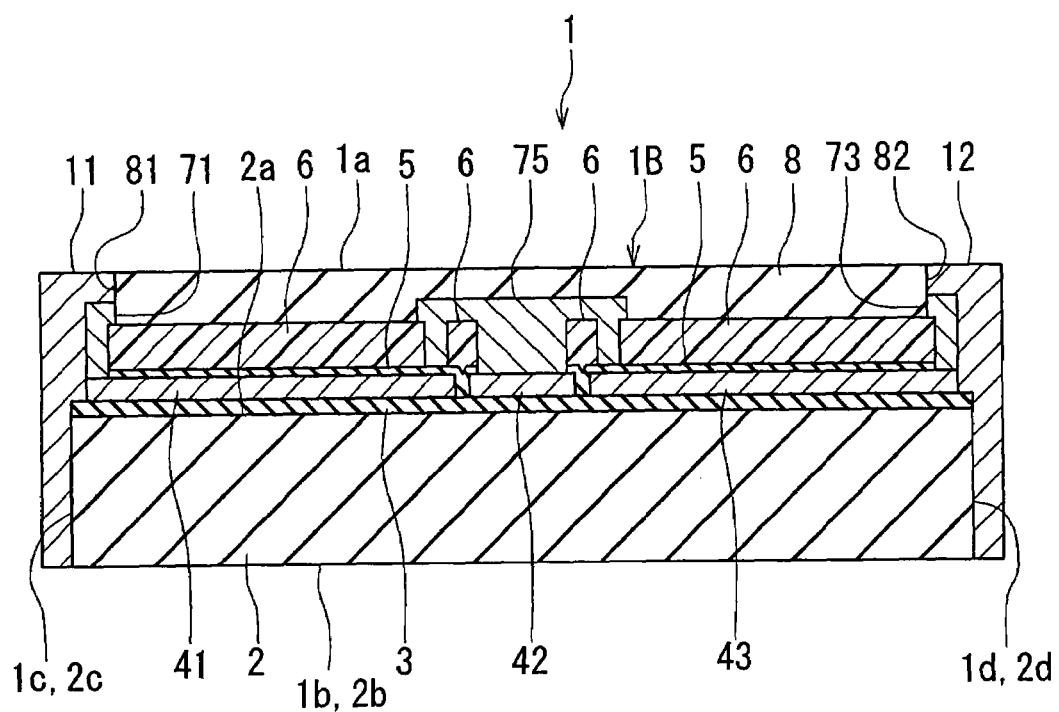
FIG. 24 is a cross-sectional view of a thin-film device of a first modification example of the second embodiment of the invention.

FIG. 24 is a cross-sectional view of the thin-film device 1 of the first modification example. FIG. 24 shows a cross section corresponding to FIG. 21. In the thin-film device 1 of the first modification example, the terminal electrodes 11 to 14 do not touch the second surface 2b of the substrate 2. The lower end faces of the terminal electrodes 11 to 14, together with the second surface 2b, form a contiguous flat surface. In the first modification example, it is possible that each of the bottom and top surfaces of the thin-film device 1 is made a flat one. The remainder of configuration, function and effects of the thin-film device 1 of the first modification example are the same as those of the thin-film device 1 shown in FIG. 21.

Figure 25:
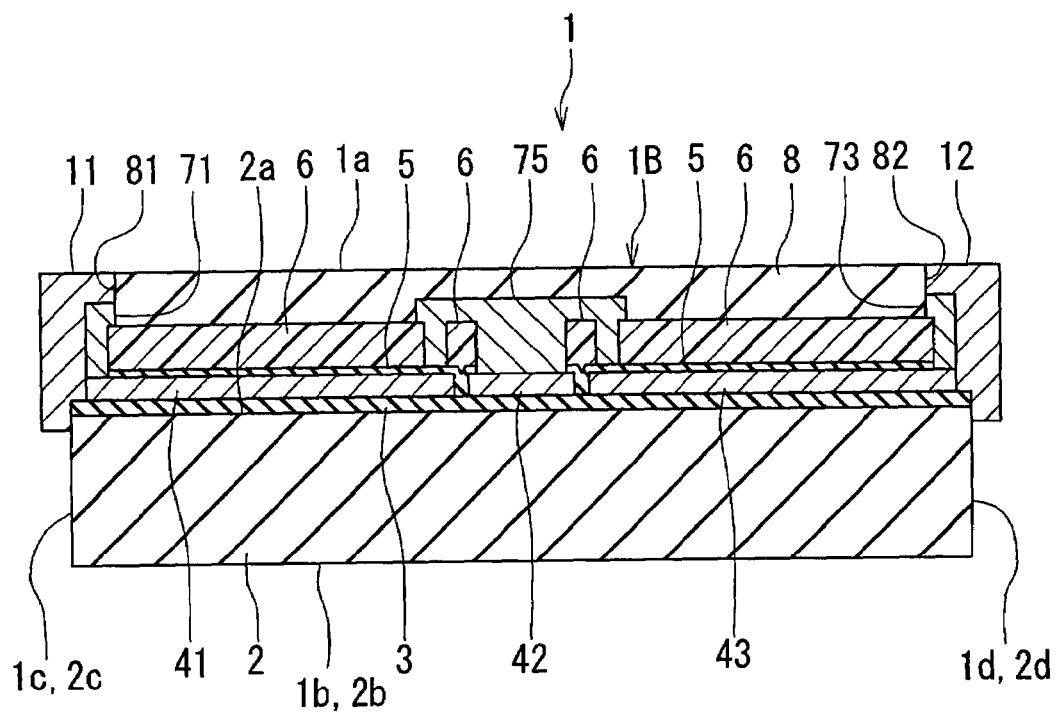
FIG. 25 is a cross-sectional view of a thin-film device of a second modification example of the second embodiment of the invention.

FIG. 25 is a cross-sectional view of the thin-film device 1 of the second modification example, which shows a cross section corresponding to FIG. 21. In the thin-film device 1 of the second modification example, the lower end faces of the terminal electrodes 11 to 14 are located at a level between the first surface 2a and the second surface 2b of the substrate 2. Consequently, the terminal electrodes 11 to 14 do not touch the second surface 2b of the substrate 2. In the second modification example, it is possible that each of the bottom and top surfaces of the thin-film device 1 is made a flat one. The remainder of configuration, function and effects of the thin-film device 1 of the second modification example are the same as those of the thin-film device 1 shown in FIG. 21.

Figure 26:
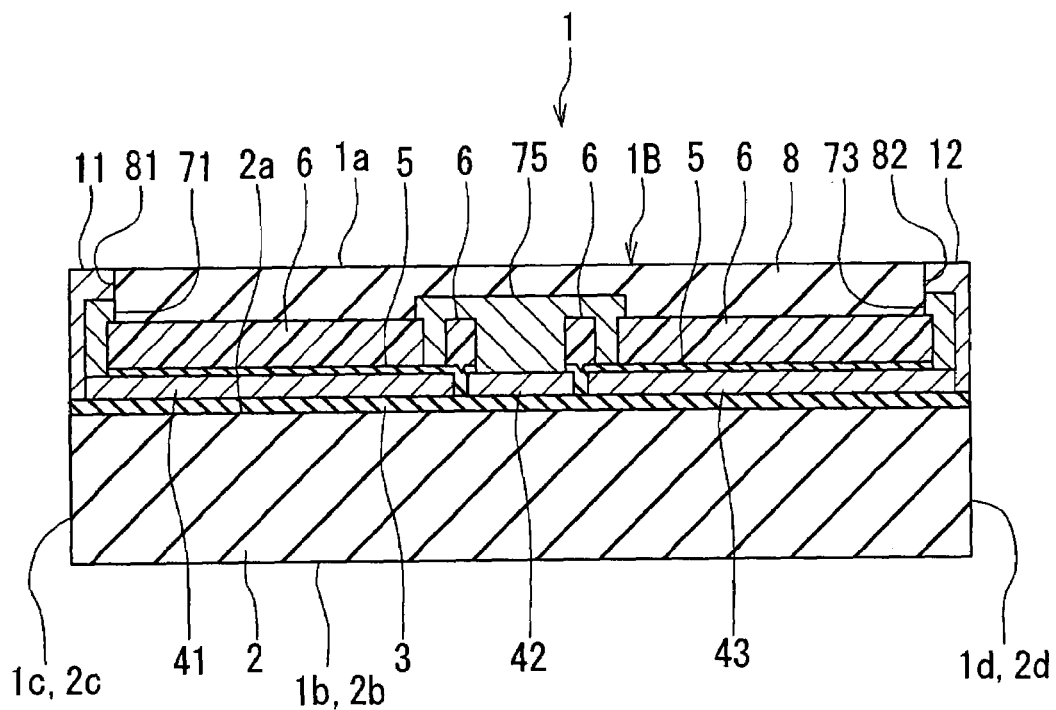
FIG. 26 is a cross-sectional view of a thin-film device of a third modification example of the second embodiment of the invention.

FIG. 26 is a cross-sectional view of the thin-film device 1 of the third modification example, which shows a cross section corresponding to FIG. 21. In the thin-film device 1 of the third modification example, the lower end faces of the terminal electrodes 11 to 14 touch part of the top surface of the insulating layer 3. Consequently, the terminal electrodes 11 to 14 do not touch the end faces of the insulating layer 3 and the side surfaces 2c to 2f and the second surface 2b of the substrate 2.

In the method of manufacturing the thin-film device 1 of the third modification example, the terminal electrodes 11 to 14 may be formed after the substructure is cut. Alternatively, conductor layers that will be the terminal electrodes 11 to 14 may be formed in the shallow recesses 9 of the substructure, and then the conductor layers and the substructure may be cut to form the terminal electrodes 11 to 14.

In the third modification example, it is possible that each of the bottom and top surfaces of the thin-film device 1 is made a flat one. In addition, it is possible to make each of the side surfaces 1c to 1f of the device main body 1B nearly flat. The remainder of configuration, function and effects of the thin-film device 1 of the third modification example are the same as those of the thin-film device 1 shown in FIG. 21.

Figure 27:
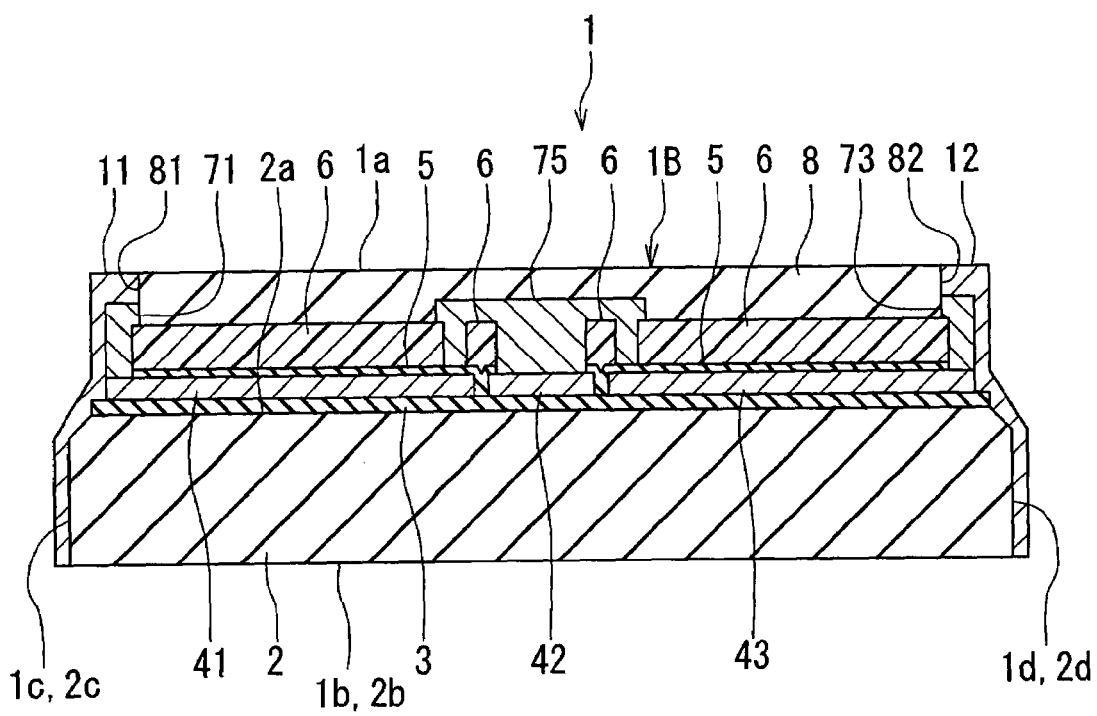
FIG. 27 is a cross-sectional view of a thin-film device of a fourth modification example of the second embodiment of the invention.

FIG. 27 is a cross-sectional view of the thin-film device 1 of the fourth modification example, which shows a cross section corresponding to FIG. 21. In the thin-film device 1 of the fourth modification example, in a portion of the substrate 2 above a specific level between the first surface 2a and the second surface 2b, the area of the cross section parallel to the first surface 2a gradually decreases as the distance from the first surface 2a decreases. In addition, portions of the side surfaces 2c to 2f of the substrate 2 located above this specific level form sloped surfaces. When the device main body 1B is seen from above, the edge of the insulating layer 3 is located at a position that coincides with the edge of the first surface 2a of the substrate 2. The terminal electrodes 11 to 14 do not touch the second surface 2b of the substrate 2. The lower end faces of the terminal electrodes 11 to 14, together with the second surface 2b, form a contiguous flat surface.

In a method of manufacturing the thin-film device 1 of the fourth modification example, after the shallow recesses 9 are formed in the step illustrated in FIG. 22, at the locations of the portions to be removed 1R, portions of the insulating layer 3 are removed in a region narrower than the width of the shallow recesses 9, and a portion of the wafer 2W above the above-mentioned specific level is removed in part so as to form a surface of the wafer 2W that will be the above-mentioned sloped surfaces later. Second shallow recesses are thereby formed in the substructure. The second shallow recesses may be formed by laser processing or processing using a dicing saw, for example. After this step, the substructure is cut with a blade having a width smaller the width of the second shallow recesses. As a result, the above-mentioned sloped surfaces are formed in the side surfaces 2c to 2f of the substrate 2. Then, the terminal electrodes 11 to 14 are formed as shown in FIG. 27.

Alternatively, the thin-film device 1 of the fourth modification example may be formed by a method that will now be described. In this method, after the second shallow recesses are formed in the substructure as described above, conductor layers that will be the terminal electrodes 11 to 14 later are formed in the shallow recesses 9 and the second shallow recesses. These conductor layers and the substructure are then cut with a blade having a width smaller the width of the second shallow recesses. The terminal electrodes 11 to 14 are thereby formed by these conductor layers that have been cut.

In the fourth modification example, each of the bottom and top surfaces of the thin-film device 1 is made flat. The remainder of configuration, function and effects of the thin-film device 1 of the fourth modification example are the same as those of the thin-film device 1 shown in FIG. 21.

Third Embodiment

A thin-film device of a third embodiment of the invention will now be described. The thin-film device of the third embodiment has a circuit configuration the same as that of the first embodiment.

Figure 28:
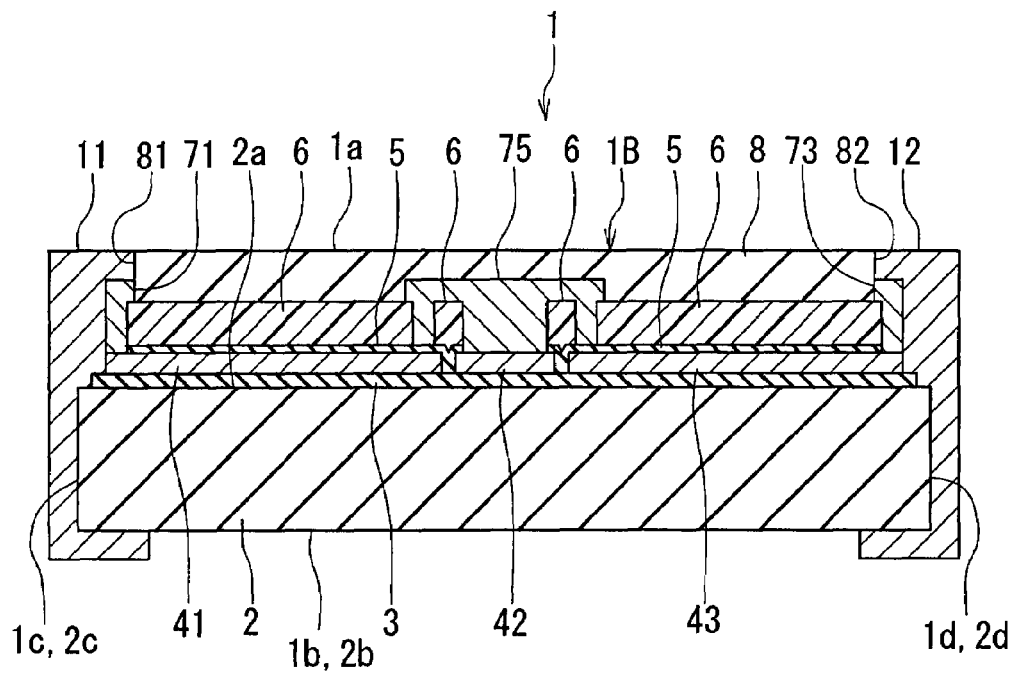
FIG. 28 is a cross-sectional view of a thin-film device of a third embodiment of the invention.

FIG. 28 is a cross-sectional view of the thin-film device of the third embodiment, which shows a cross section corresponding to FIG. 5. In the thin-film device 1 of the third embodiment, when the device main body 1B is seen from above, the edge of the insulating layer 3 is located on an inner side relative to the edge of the first surface 2a of the substrate 2. Furthermore, when the device main body 1B is seen from above, the end faces of the lower conductor layers 41, 43, 44 and 45 and the end faces of the upper conductor layers 71, 73, 74 and 72 disposed at the side surfaces 1c to 1f of the device main body 1B are located on an inner side relative to the edge of the insulating layer 3. As a result, two-step differences in level are created in the side surfaces 1c to 1f of the device main body 1B, so that the end faces of the insulating layer 3 protrude more outward in a lateral direction than a portion above the level of the top surface of the insulating layer 3, and that the side surfaces 2c to 2f of the substrate 2 protrude more outward in a lateral direction than the end faces of the insulating layer 3. In the third embodiment, the terminal electrodes 11 to 14 touch portions of the top surface of the insulating layer 3 and portions of the first surface 2a of the substrate 2.

Figure 29:
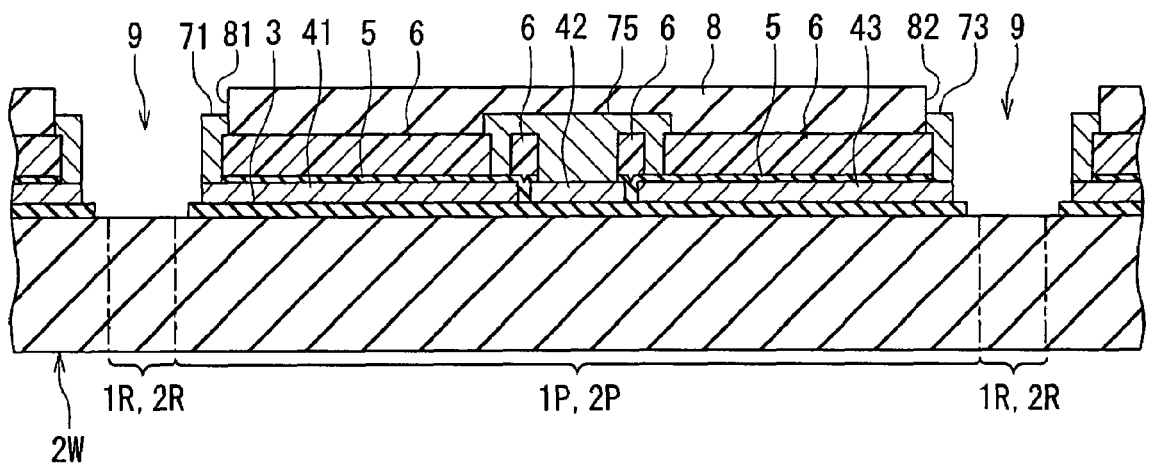
FIG. 29 is a cross-sectional view illustrating a step of a method of manufacturing the thin-film device of the third embodiment of the invention.
Figure 30:
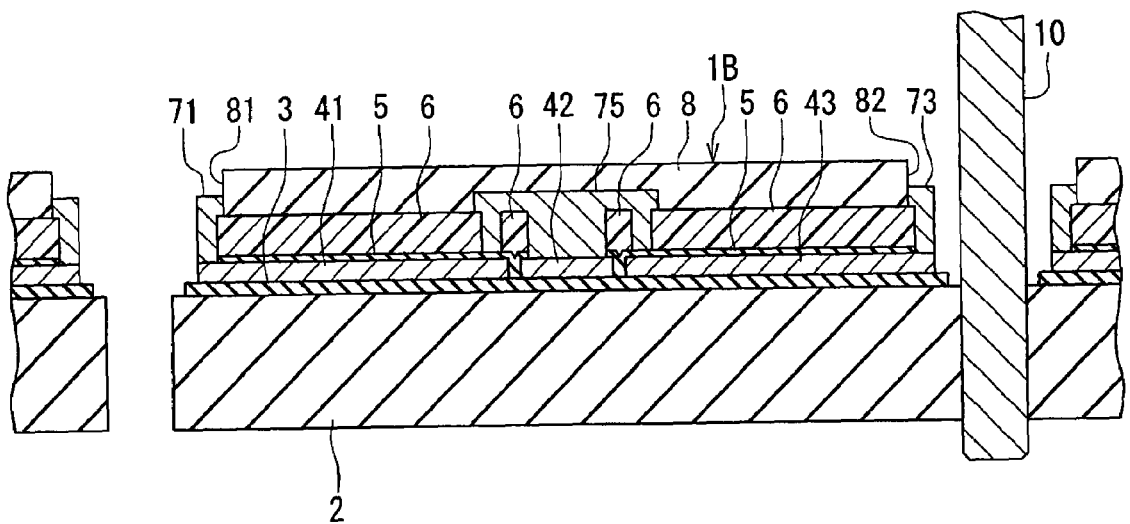
FIG. 30 is a cross-sectional view illustrating a step that follows the step of FIG. 29.

Reference is now made to FIG. 28 to FIG. 30 to describe a method of manufacturing the thin-film device 1 of the third embodiment. FIG. 29 and FIG. 30 are cross-sectional views for describing the method of manufacturing the thin-film device 1 of the third embodiment. FIG. 29 and FIG. 30 show cross sections corresponding to FIG. 28. The method of the third embodiment includes the steps up to the step of fabricating the thin-film device substructure, as shown in FIG. 12, that are the same as those of the first embodiment.

FIG. 29 illustrates the following step. In the step, shallow recessing is performed on the thin-film device substructure at the locations of the portions to be removed 1R. In this shallow recessing, portions of the upper conductor layers 71, 73, 74 and 72, portions of the lower conductor layers 41, 43, 44 and 45, and portions of the insulating layer 3 are removed in a region wider than the width of the portions to be removed 1R. The shallow recesses 9 are thereby formed in the thin-film device substructure. As a result, the end faces to be connected to the terminal electrodes 11 to 14 are formed in the lower conductor layers 41, 43, 44 and 45 and the upper conductor layers 71, 73, 74 and 72. In the third embodiment, the shallow recesses 9 are formed so that the end faces of the lower conductor layers 41, 43, 44 and 45 and the end faces of the upper conductor layers 71, 73, 74 and 72 are located on an inner side relative to the edge of the insulating layer 3. The shallow recessing may be performed by laser processing or processing using a dicing saw, for example.

Alternatively, the upper conductor layers 71, 73, 74 and 72, the lower conductor layers 41, 43, 44 and 45, and the insulating layer 3 may be formed in advance into the shapes that would be obtained by undergoing the shallow recessing, and the protection film 8 may be formed in the regions to be removed by the shallow recessing. In this case, the shallow recesses 9 can be formed by removing the protection film 8 in these regions when the protection film 8 is processed in the step shown in FIG. 12.

Next, as shown in FIG. 30, the substructure is cut at the locations of the portions to be removed 1R, as in the step shown in FIG. 13. As a result, the two-step differences in level described previously are formed in the side surfaces 1c to 1f of the device main body 1B. Then, the terminal electrodes 11 to 14 are formed as shown in FIG. 28.

In the third embodiment, since the two-step differences in level are formed in the side surfaces 1c to 1f of the device main body 1B, it is possible that the areas of the regions in which the terminal electrodes 11 to 14 touch the side surfaces 1c to 1f are made greater than those of the first embodiment. According to the third embodiment, it is thereby possible to enhance the strength of bonding of the terminal electrodes 11 to 14 to the device main body 1B.

The remainder of configuration, function and effects of the thin-film device 1 of the third embodiment are the same as those of the thin-film device 1 shown in FIG. 1 to FIG. 6.

In the third embodiment, too, as in the first modification example of the first embodiment, when the protection film 8 is seen from above, the edge of the protection film 8 except the portions corresponding to the concave portions 81 to 84 may be located on an inner side relative to the edge of the surface located directly below the protection film 8, that is, the edge of the surface formed by the top surface of the insulating layer 6 and the top surfaces of the upper conductor layers 71 to 76.

Reference is now made to FIG. 31 to FIG. 35 to describe first to fifth modification examples of the third embodiment.

Figure 31:
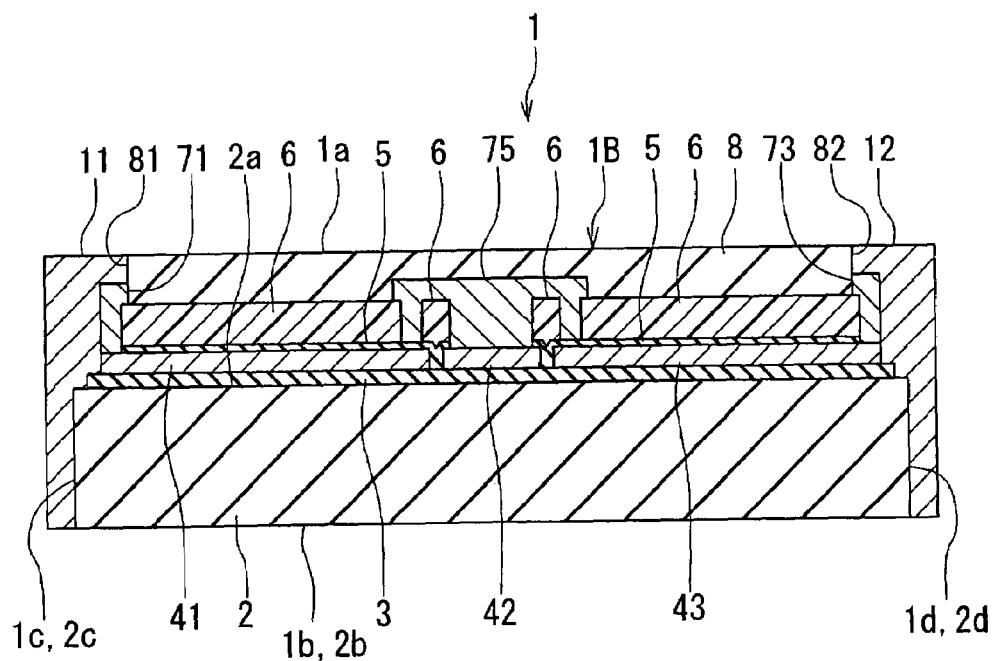
FIG. 31 is a cross-sectional view of a thin-film device of a first modification example of the third embodiment of the invention.

FIG. 31 is a cross-sectional view of the thin-film device 1 of the first modification example. FIG. 31 shows a cross section corresponding to FIG. 28. In the thin-film device 1 of the first modification example, the terminal electrodes 11 to 14 do not touch the second surface 2b of the substrate 2. The lower end faces of the terminal electrodes 11 to 14, together with the second surface 2b, form a contiguous flat surface. In the first-modification example, it is possible that each of the bottom and top surfaces of the thin-film device 1 is made a flat one. The remainder of configuration, function and effects of the thin-film device 1 of the first modification example are the same as those of the thin-film device 1 shown in FIG. 28.

Figure 32:
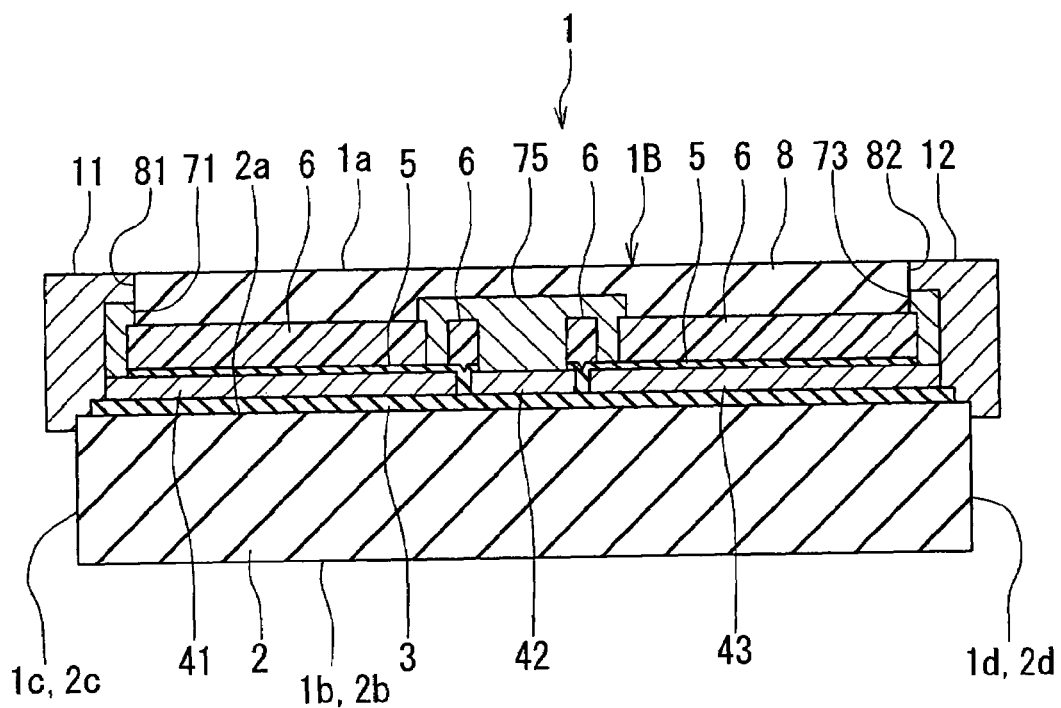
FIG. 32 is a cross-sectional view of a thin-film device of a second modification example of the third embodiment of the invention.

FIG. 32 is a cross-sectional view of the thin-film device 1 of the second modification example, which shows a cross section corresponding to FIG. 28. In the thin-film device 1 of the second modification example, the lower end faces of the terminal electrodes 11 to 14 are located at a level between the first surface 2a and the second surface 2b of the substrate 2. Consequently, the terminal electrodes 11 to 14 do not touch the second surface 2b of the substrate 2. In the second modification example, it is possible that each of the bottom and top surfaces of the thin-film device 1 is made a flat one. The remainder of configuration, function and effects of the thin-film device 1 of the second modification example are the same as those of the thin-film device 1 shown in FIG. 28.

Figure 33:
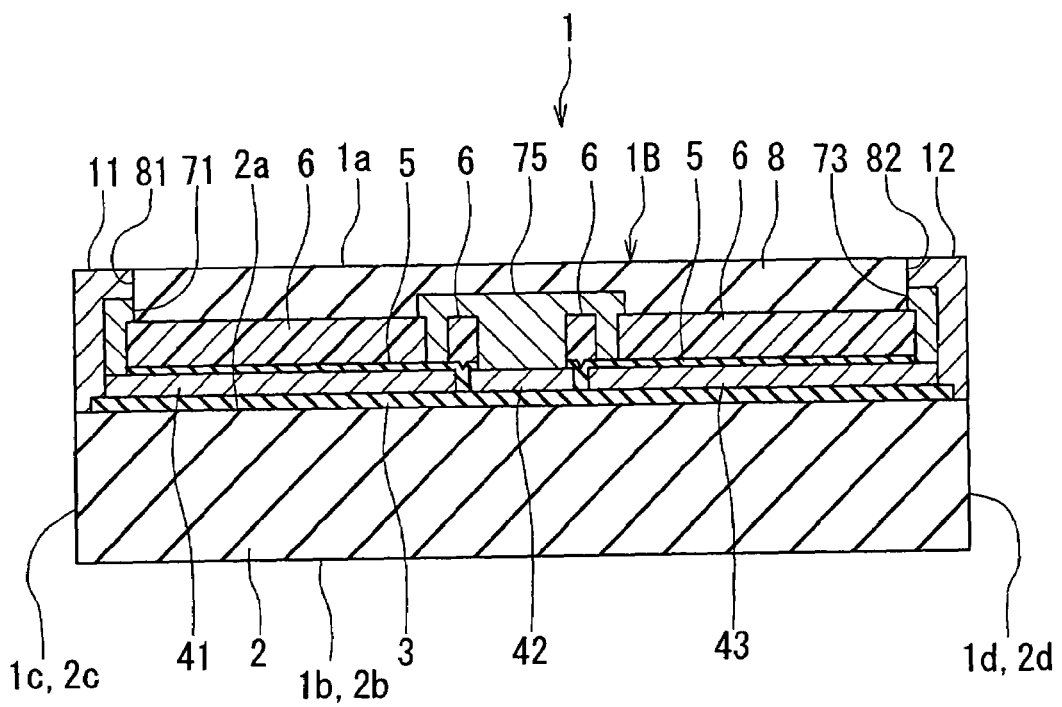
FIG. 33 is a cross-sectional view of a thin-film device of a third modification example of the third embodiment of the invention.

FIG. 33 is a cross-sectional view of the thin-film device 1 of the third modification example, which shows a cross section corresponding to FIG. 28. In the thin-film device 1 of the third modification example, the lower end faces of the terminal electrodes 11 to 14 touch part of the first surface 2a of the substrate 2. Consequently, the terminal electrodes 11 to 14 do not touch the side surfaces 2c to 2f and the second surface 2b of the substrate 2.

In the method of manufacturing the thin-film device 1 of the third modification example, the terminal electrodes 11 to 14 may be formed after the substructure is cut. Alternatively, conductor layers that will be the terminal electrodes 11 to 14 may be formed in the shallow recesses 9 of the substructure, and then the conductor layers and the substructure may be cut to form the terminal electrodes 11 to 14.

In the third modification example, it is possible that each of the bottom and top surfaces of the thin-film device 1 is made a flat one. In addition, it is possible to make each of the side surfaces 1c to 1f of the device main body 1B nearly flat. The remainder of configuration, function and effects of the thin-film device 1 of the third modification example are the same as those of the thin-film device 1 shown in FIG. 28.

Figure 34:
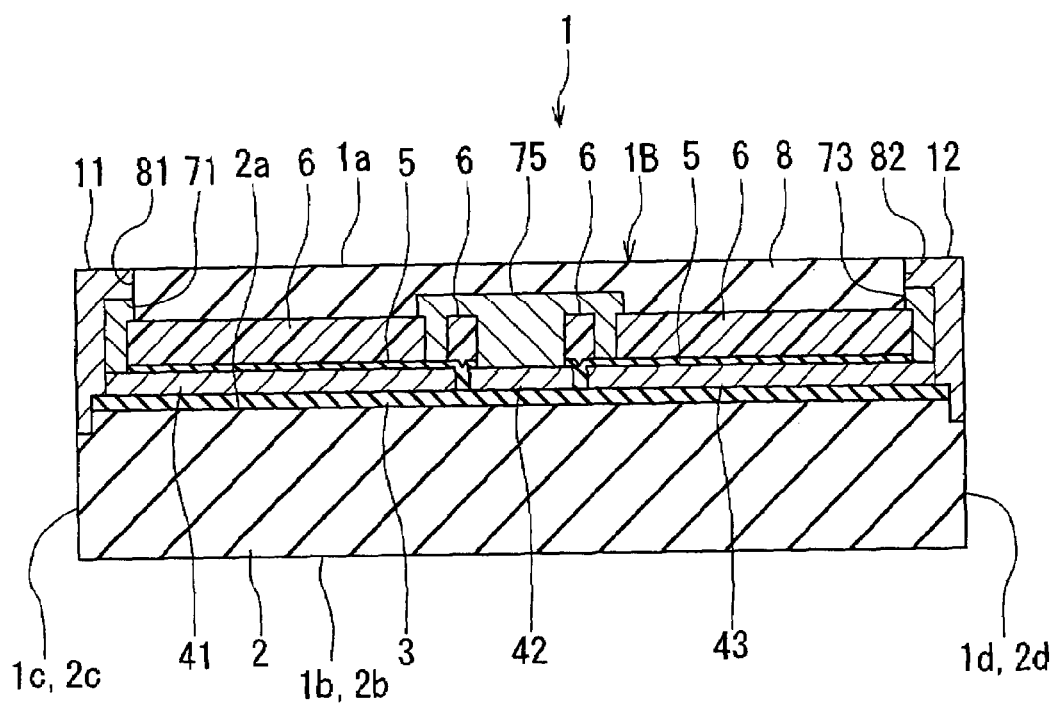
FIG. 34 is a cross-sectional view of a thin-film device of a fourth modification example of the third embodiment of the invention.

FIG. 34 is a cross-sectional view of the thin-film device 1 of the fourth modification example, which shows a cross section corresponding to FIG. 28. In the thin-film device 1 of the fourth modification example, differences in level are created in the side surfaces 2c to 2f of the substrate 2, so that portions below a specific level between the first surface 2a and the second surface 2b protrude more outward in a lateral direction than portions above this level. When the device main body 1B is seen from above, the edge of the insulating layer 3 is located at a position that coincides with the edge of the first surface 2a of the substrate 2. As a result, two-step differences in level are created in the side surfaces 1c to 1f of the device main body 1B, so that the end faces of the insulating layer 3 and the portions of the side surfaces 2c to 2f of the substrate 2 located above the aforementioned specific level protrude more outward in a lateral direction than portions located above the level of the top surface of the insulating layer 3, and that the portions of the side surfaces 2c to 2f of the substrate 2 located below the specific level protrude more outward in a lateral direction than the end faces of the insulating layer 3 and the portions of the side surfaces 2c to 2f located above the specific level. The lower end faces of the terminal electrodes 11 to 14 are located at this specific level. The terminal electrodes 11 to 14 touch part of the portions of the side surfaces 2c to 2f of the substrate 2 located above this specific level. The terminal electrodes 11 to 14 do not touch the second surface 2b of the substrate 2.

In a method of manufacturing the thin-film device 1 of the fourth modification example, after the step illustrated in FIG. 29, half-cut processing is performed on the thin-film device substructure at the locations of the portions to be removed 1R. In this half-cut processing, portions of the insulating layer 3 are removed in a region narrower than the width of the shallow recess 9 and wider than the width of the portions to be removed 1R, and a portion of the wafer 2W above the above-mentioned specific level is removed to form grooves in the substructure. The half-cut processing may be performed by processing using a dicing saw, for example. After this step, as in the step shown in FIG. 30, the substructure is cut at the locations of the portions to be removed 1R. As a result, the two-step differences in level described previously are formed in the side surfaces 1c to 1f of the device main body 1B. Then, the terminal electrodes 11 to 14 are formed as shown in FIG. 34.

Alternatively, the thin-film device 1 of the fourth modification example may be formed by a method that will now be described. In this method, after the grooves are formed in the substructure as described above, conductor layers that will be the terminal electrodes 11 to 14 later are formed in the grooves. These conductor layers and the substructure are then cut at the locations of the portions to be removed 1R. The terminal electrodes 11 to 14 are thereby formed by these conductor layers that have been cut.

In the fourth modification example, each of the bottom and top surfaces of the thin-film device 1 is made flat. In addition, it is possible to make each of the side surfaces 1c to 1f of the device main body 1B nearly flat. The remainder of configuration, function and effects of the thin-film device 1 of the fourth modification example are the same as those of the thin-film device 1 shown in FIG. 28.

Figure 35:
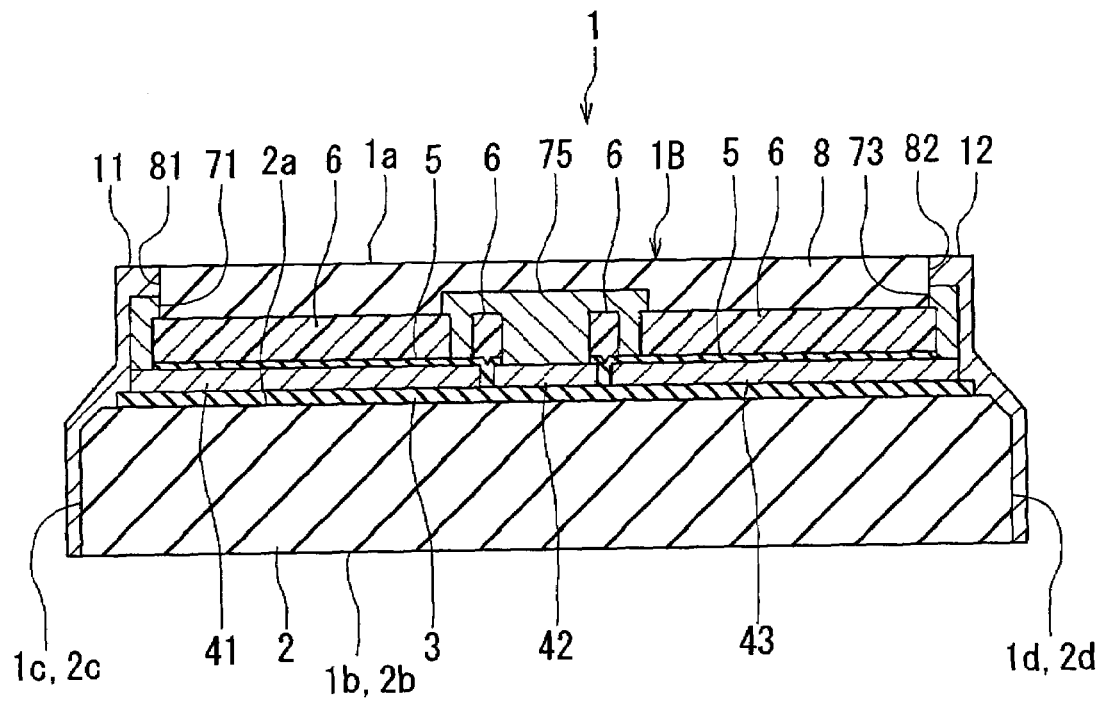
FIG. 35 is a cross-sectional view of a thin-film device of a fifth modification example of the third embodiment of the invention.

FIG. 35 is a cross-sectional view of the thin-film device 1 of the fifth modification example, which shows a cross section corresponding to FIG. 28. In the thin-film device 1 of the fifth modification example, in a portion of the substrate 2 above a specific level between the first surface 2a and the second surface 2b, the area of the cross section parallel to the first surface 2a gradually decreases as the distance from the first surface 2a decreases. In addition, portions of the side surfaces 2c to 2f of the substrate 2 located above this specific level form sloped surfaces. When the device main body 1B is seen from above, the edge of the insulating layer 3 is located on an inner side relative to the edge of the first surface 2a of the substrate 2. The terminal electrodes 11 to 14 do not touch the second surface 2b of the substrate 2. The lower end faces of the terminal electrodes 11 to 14, together with the second surface 2b, form a contiguous flat surface.

In a method of manufacturing the thin-film device 1 of the fifth modification example, after the shallow recesses 9 are formed in the step illustrated in FIG. 29, at the locations of the portions 1R to be removed, a portion of the wafer 2W above the above-mentioned specific level is removed in part so as to form a surface of the wafer 2W that will be the above-mentioned sloped surfaces later. Second shallow recesses are thereby formed in the substructure. The second shallow recesses may be formed by laser processing or processing using a dicing saw, for example. After this step, the substructure is cut with a blade having a width smaller the width of the second shallow recesses. As a result, the above-mentioned sloped surfaces are formed in the side surfaces 2c to 2f of the substrate 2. Then, the terminal electrodes 11 to 14 are formed as shown in FIG. 35.

Alternatively, the thin-film device 1 of the fifth modification example may be formed by a method that will now be described. In this method, after the second shallow recesses are formed in the substructure as described above, conductor layers that will be the terminal electrodes 11 to 14 later are formed in the shallow recesses 9 and the second shallow recess. These conductor layers and the substructure are then cut with a blade having a width smaller the width of the second shallow recesses. The terminal electrodes 11 to 14 are thereby formed by these conductor layers that have been cut.

In the fifth modification example, each of the bottom and top surfaces of the thin-film device 1 is made flat. The remainder of configuration, function and effects of the thin-film device 1 of the fifth modification example are the same as those of the thin-film device 1 shown in FIG. 28.

The present invention is not limited to the foregoing embodiments but may be practiced in still other ways. For example, the thin-film device of the invention may include a semiconductor layer or a magnetic layer in addition to the conductor layers. Furthermore, the number of terminal electrodes of the thin-film device of the invention is not limited to four but may be any number.

The invention is applicable not only to thin-film devices having the function of a band-pass filter disclosed in the embodiments but also to thin-film devices in general incorporating conductor layers and terminal electrodes connected to the conductor layers. Functions of thin-film devices to which the invention is applied include those of passive elements such as a capacitor and an inductor, active elements such as a transistor, and circuits including a plurality of elements. Specifically, such circuits include an LC circuit component, various sorts of filters such as a low-pass filter, a high-pass filter and a band-pass filter, a diplexer, and a duplexer.

The thin-film device of the invention is utilized for a mobile communications apparatus such as a cellular phone and a communications apparatus for a wireless local area network (LAN).

Obviously many modifications and variations of the present invention are possible in the light of the above teachings. It is therefore to be understood that within the scope of the appended claims the invention may be practiced otherwise than as specifically described.

What is claimed is:

1. A thin-film device comprising:
 a substrate having a first surface and a second surface that face toward opposite directions, and a side surface coupling the first and second surfaces to each other;
 a protection film disposed such that one of surfaces thereof faces toward the first surface of the substrate;
 a conductor layer disposed between the first surface of the substrate and the protection film, the conductor layer having a bottom surface facing toward the first surface of the substrate, a top surface opposite to the bottom surface, and an end face coupling the bottom and top surfaces to each other; and a terminal electrode connected to the conductor layer, wherein:

the terminal electrode touches part of the end face of the conductor layer and part of the top surface of the conductor layer contiguous to the end face; and the protection film has a concave portion having a shape that is recessed inward from an edge of the protection film except a portion thereof corresponding to the concave portion, the concave portion exposing the part of the top surface of the conductor layer that touches the terminal electrode, and accommodating part of the terminal electrode.

2. The thin-film device according to claim 1, wherein, when the protection film is seen from above, the edge of the protection film except the portion thereof corresponding to the concave portion is located at a position that coincides with an edge of a surface located directly below the protection film.

3. The thin-film device according to claim 1, wherein, when the protection film is seen from above, the edge of the protection film except the portion thereof corresponding to the concave portion is located on an inner side relative to an edge of a surface located directly below the protection film.

4. The thin-film device according to claim 1, wherein the terminal electrode further touches part of the side surface of the substrate.

5. The thin-film device according to claim 1, wherein the terminal electrode further touches part of the first surface of the substrate.

6. The thin-film device according to claim 1, wherein the terminal electrode further touches part of the first surface of the substrate and part of the side surface of the substrate.

7. The thin-film device according to claim 1, further comprising an insulating layer disposed between the first surface of the substrate and the conductor layer, the insulating layer having a bottom surface facing toward the first surface of the substrate, a top surface opposite to the bottom surface, and an end face coupling the bottom and top surfaces to each other.

8. The thin-film device according to claim 7, wherein the terminal electrode further touches part of the end face of the insulating layer.

9. The thin-film device according to claim 7, wherein the terminal electrode further touches part of the top surface of the insulating layer.

10. The thin-film device according to claim 7, wherein the terminal electrode further touches part of the top surface of the insulating layer and part of the end face of the insulating layer.

11. The thin-film device according to claim 7, wherein the terminal electrode further touches part of the end face of the insulating layer and part of the side surface of the substrate.

12. The thin-film device according to claim 7, wherein the terminal electrode further touches part of the end face of the insulating layer and part of the first surface of the substrate.

13. The thin-film device according to claim 7, wherein the terminal electrode further touches part of the end face of the insulating layer, part of the first surface of the substrate, and part of the side surface of the substrate.

14. The thin-film device according to claim 7, wherein the terminal electrode further touches part of the top surface of the insulating layer, part of the end face of the insulating layer, and part of the side surface of the substrate.

15. The thin-film device according to claim 7, wherein the terminal electrode further touches part of the top surface of the insulating layer, part of the end face of the insulating layer, and part of the first surface of the substrate.

16. The thin-film device according to claim 7, wherein the terminal electrode further touches part of the top surface of the insulating layer, part of the end face of the insulating layer, part of the first surface of the substrate, and part of the side surface of the substrate.

* * * * *